(12) United States Patent
Miyajima

(10) Patent No.: US 7,842,518 B2
(45) Date of Patent: Nov. 30, 2010

(54) METHOD FOR FABRICATING SEMICONDUCTOR DEVICE

(75) Inventor: Hideshi Miyajima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 483 days.

(21) Appl. No.: 11/933,785

(22) Filed: Nov. 1, 2007

(65) Prior Publication Data

US 2008/0108153 A1    May 8, 2008

(30) Foreign Application Priority Data

Nov. 2, 2006    (JP) ............... 2006-299022

(51) Int. Cl.
    *H01L 21/00* (2006.01)
(52) U.S. Cl. ............... 438/4; 438/409; 438/778; 438/791; 257/E21.001; 257/E21.273
(58) Field of Classification Search .......... 438/4, 438/409, 778, 791; 257/E21.001, E21.273
    See application file for complete search history.

(56) References Cited

U.S. PATENT DOCUMENTS

| | | | | |
|---|---|---|---|---|
| 6,855,645 | B2 * | 2/2005 | Tang et al. .................. | 438/778 |
| 2005/0287790 | A1 * | 12/2005 | Owada et al. ............... | 438/622 |
| 2007/0037374 | A1 * | 2/2007 | Hayashi et al. ............. | 438/597 |
| 2007/0249156 | A1 * | 10/2007 | Bonilla et al. .............. | 438/622 |
| 2009/0017563 | A1 * | 1/2009 | Jiang et al. ................. | 438/4 |

FOREIGN PATENT DOCUMENTS

| | | |
|---|---|---|
| JP | 2002-353308 | 12/2002 |
| JP | 2006-073799 | 3/2006 |
| JP | 2006-114719 | 4/2006 |

OTHER PUBLICATIONS

Nakamura, N. et al., "A Plasma Damage Resistant Ultra Low-k Hybrid Dielectric Structure for 45nm Node Copper Dual-Damascene Interconnects," Proceeding of the IEEE 2004 International Interconnect Technology Conference, pp. 228-230, (Jun. 7-9, 2004).

Kojima, A. et al., "Silylation Gas Restoration Subsequent to All-in-one RIE Process without Air Exposure for Porous Low-k SiOC/Copper Dual-Damascene Interconnects," Advanced Metallization Conference 2006, (AMC 2006), Conference Proceedings AMC XXII, Materials Research Society, pp. 301-305, (2007).

Nakamura, N. et al., "Impact of Damage Restoration Process on electrical Properties and Reliability of Porous Low-k SiOC/Copper Dual-Damascene Interconnects," Advanced Metallization Conference 2005, (AMC 2005), Conference Proceedings AMC XXI, Materials Research Society, pp. 707-713, (2006).

* cited by examiner

*Primary Examiner*—Matthew C Landau
*Assistant Examiner*—Colleen E Snow
(74) *Attorney, Agent, or Firm*—Finnegan, Henderson, Farabow, Garrett & Dunner, L.L.P.

(57) ABSTRACT

A method for fabricating a semiconductor device, includes forming a porous dielectric film above a substrate using a porous insulating material, forming an opening in the porous dielectric film, repairing film quality of the porous dielectric film on a surface of the opening by feeding a predetermined gas replacing a Si—OH group to the opening, and performing pore sealing of the surface of the opening using the same predetermined gas as that used for film quality repairs after repairing the film quality.

19 Claims, 21 Drawing Sheets

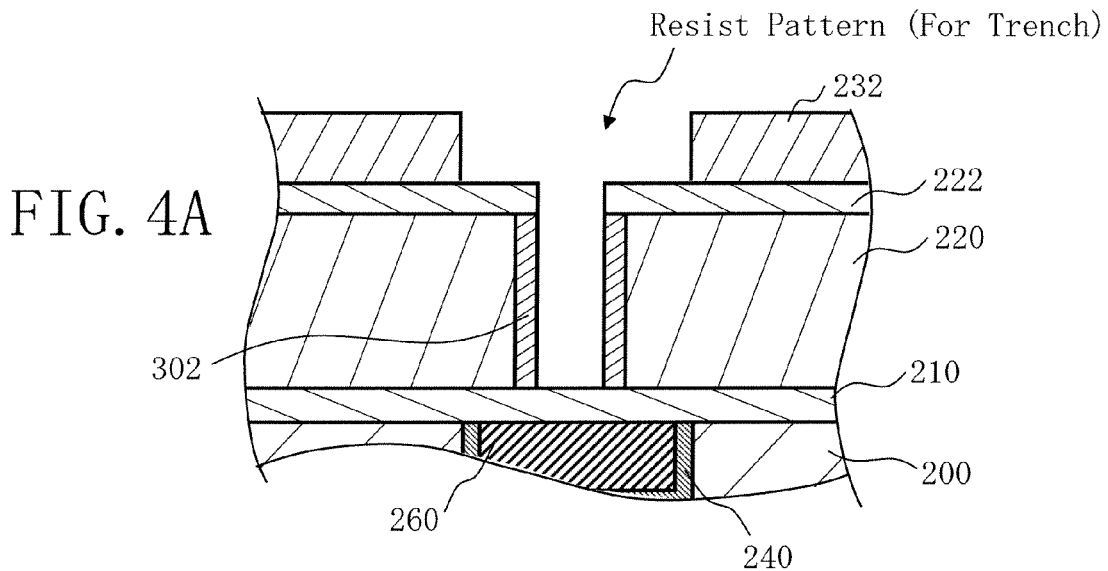
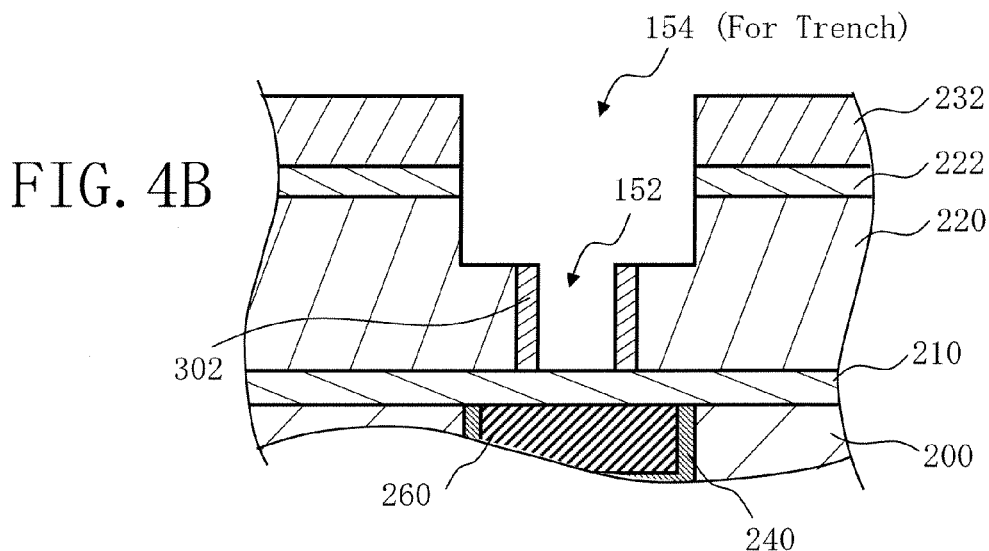
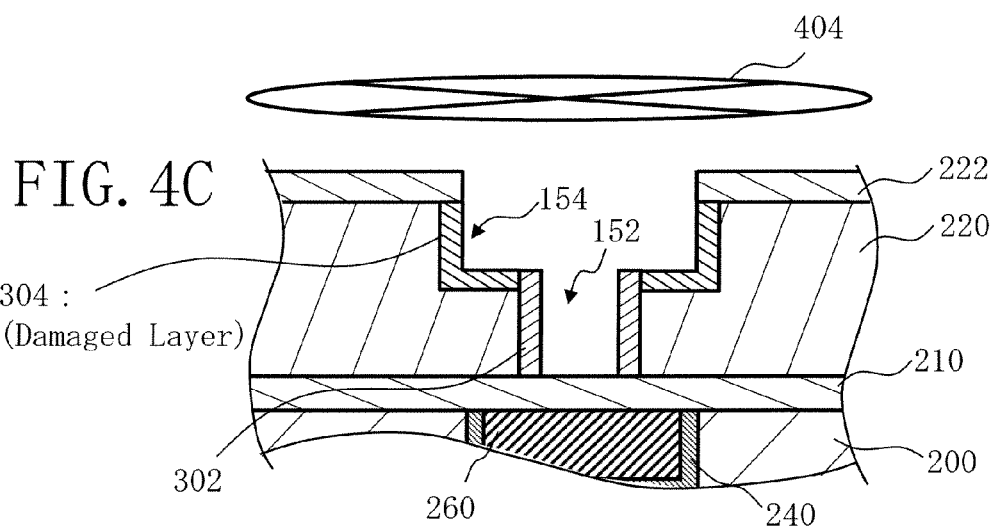

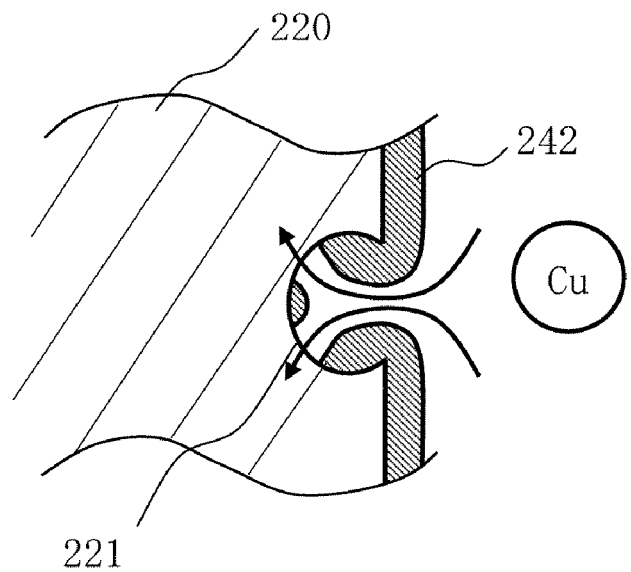
FIG. 8A
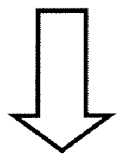
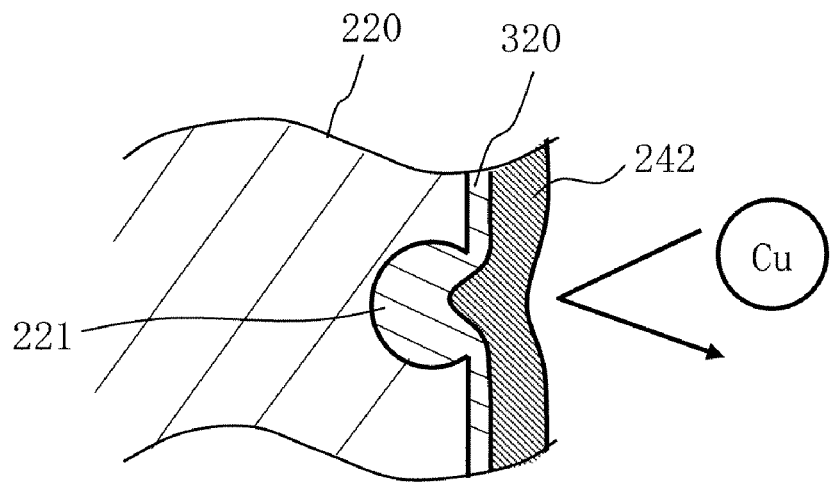
FIG. 8B

312 : (Repair Layer)

Resist Pattern (For Trench)

154 : (Trench)

METHOD FOR FABRICATING SEMICONDUCTOR DEVICE

CROSS-REFERENCE TO RELATED APPLICATION

This application is based upon and claims the benefit of priority from prior Japanese Patent Application No. 2006-299022 filed on Nov. 2, 2006 in Japan, the entire contents of which are incorporated herein by reference.

BACKGROUND OF THE INVENTION

1. Field of the Invention

The present invention relates to a method for fabricating a semiconductor device, and for example, relates to a method for fabricating a semiconductor device forming a porous low dielectric constant dielectric film.

2. Related Art

With increasingly more microscopic and faster semiconductor devices, a wiring structure is moving from a single layer to multiple layers and semiconductor devices having five layers or more of metallic wiring structures have been developed and manufactured. However, as semiconductor devices become still finer, problems of a so-called inter-wire parasitic capacity and a signal transmission delay due to wire resistance have arisen. Then, in recent years, a signal transmission delay resulting from a multi-layer wiring structure is increasingly affecting speedup of semiconductor devices and various steps have been taken as measures for preventing such a delay. The signal transmission delay can generally be obtained by a product of the above inter-wire parasitic capacity and wire resistance. Thus, particularly in recent years, there is a trend to replace a conventional aluminum (Al) alloy as a wiring material with copper (Cu) or a Cu alloy (hereinafter referred to as Cu together) with low resistance to achieve speedup of LSI by lowering wire resistance. Since it is difficult to apply a dry etching method, which is frequently used for forming Al alloy wires, to Cu for micro processing, a damascene process is mainly adopted for Cu, in which a Cu film is deposited on a dielectric film, or "an insulating film" to which groove processing has been provided and then the Cu film is removed except in portions where the Cu film is embedded in a groove by chemical-mechanical polishing (CMP) to form embedded wiring. The Cu film is generally formed, after forming a thin seed layer by a sputtering process or the like, into a laminated film having a thickness of several hundred nanometers by electrolytic plating. Further, when forming multi-layer Cu wiring, particularly a wiring formation method called a dual damascene structure can also be used. In this method, a dielectric film is deposited on lower layer wiring and predetermined via holes and trenches for upper layer wiring are formed, and then Cu to be wiring material is embedded in the via holes and trenches simultaneously and further unnecessary Cu in the upper layer is removed by CMP for planarization to form embedded wiring.

To reduce the inter-wire capacity, on the other hand, instead of a dielectric film by the chemical vapor deposition (CVD) process using conventional silicon oxide ($SiO_2$), the use of a SiCO film by the CVD process and that of a so-called coating film or an organic resin (polymer) film having SiCO composition by a coating method as a low dielectric constant material insulating film (low-k film) having fine pores have been studied. While a $SiO_2$ film has the relative dielectric constant of 3.9, particularly a low dielectric constant coating film is believed to be capable of lowering the relative dielectric constant up to about 2.0 and thus is currently intensively being studied. A SiCO film formed by the CVD process whose relative dielectric constant can similarly be lowered has been widely used in recent years. However, such dielectric films having lower dielectric constants pose, on the other hand, a problem of mechanically weaker film strength.

Here, a SiCO film by the coating method or CVD process is known to be damaged by etching when forming a via hole or trench or in processes such as plasma ashing for separating a mask for etching and cleaning by a chemical solution. For a SiCO film, organic components (C (carbon) components) in the film are affected during the above processes to form a Si—OH group, which is an adsorption site of moisture, on the surface of or in the film. Thus, there has been a problem of increased hygroscopicity of the film. Particularly if the SiCO film is formed with a porous structure, gases are more likely to penetrate because of pores in the film. Therefore, the film will be damaged in a wider range. Further, the inclusion of moisture increases the dielectric constant and also oxidizes metal wires in post process, particularly in a thermal operation, causing a failure leading to degradation of wiring reliability.

When forming a barrier metal of Ta or the like to prevent diffusion of Cu into the low-k film, the barrier metal may not be formable as a continuous film because of exposed pores existing in a low dielectric constant film on a formed trench wall or via hole side wall. In such a case, a failure phenomenon of diffusion of Cu from a Cu wiring portion into the low-k film will be caused in post process or when a semiconductor device is operating. Such a failure phenomenon will lead to a problem of causing an open failure of metal wiring in the end. Particularly, the barrier metal tends to be discontinuous on the side wall of a via hole to be a micro-hole. Therefore, a technology to close pores exposed on the surface has been studied.

Here, a technology to repair the Si—OH bond on a damaged low-k film surface to the Si—$CH_3$ bond by exposing the low-k film surface to an HMDS gas has been disclosed (for example, Published Unexamined Japanese Patent Application No. 2002-353308). Besides, a technology to substitute a hydrophilic group for the Si—OH bond on a low-k film surface has been disclosed (for example, Published Unexamined Japanese Patent Application No. 2006-114719 or 2006-73799). However, pores exposed on the low-k film surface cannot be closed by these repair technologies. Moreover, with these repair technologies, mechanical strength of the low-k film is not sufficient.

BRIEF SUMMARY OF THE INVENTION

A method for fabricating a semiconductor device according to an aspect of the present invention includes forming a porous dielectric film above a substrate using a porous insulating material, forming an opening in the porous dielectric film, repairing film quality of the porous dielectric film on a surface of the opening by feeding a predetermined gas replacing a Si—OH group to the opening, and performing pore sealing of the surface of the opening using the same predetermined gas as that used for film quality repairs after repairing the film quality.

A method for fabricating a semiconductor device according to another aspect of the present invention includes forming a porous dielectric film above a substrate using a porous insulating material, exposing the porous dielectric film to an oxygen plasma atmosphere, and repairing film quality of the porous dielectric film by feeding a predetermined material that replaces a Si—OH group and also has a Si—C—Si bond to the porous dielectric film exposed to the oxygen plasma atmosphere.

BRIEF DESCRIPTION OF THE DRAWINGS

FIG. 4A to FIG. 4C are process sectional views showing processes performed corresponding to the flow chart of FIG. 1;

FIG. 8A and FIG. 8B are conceptual diagrams for illustrating pore sealing;

DETAILED DESCRIPTION OF THE INVENTION

In embodiments that follow, fabricating, or "manufacturing" methods of a semiconductor device that overcome the above problems and efficiently perform both processes of repairing adsorption sites in a porous dielectric film, or "insulating film" and closing pores exposed on a surface will be described. Also, manufacturing methods of a semiconductor device that, in addition to repairing adsorption sites in a porous dielectric film, improve mechanical strength of the porous dielectric film will be described.

First Embodiment

Figure 1:
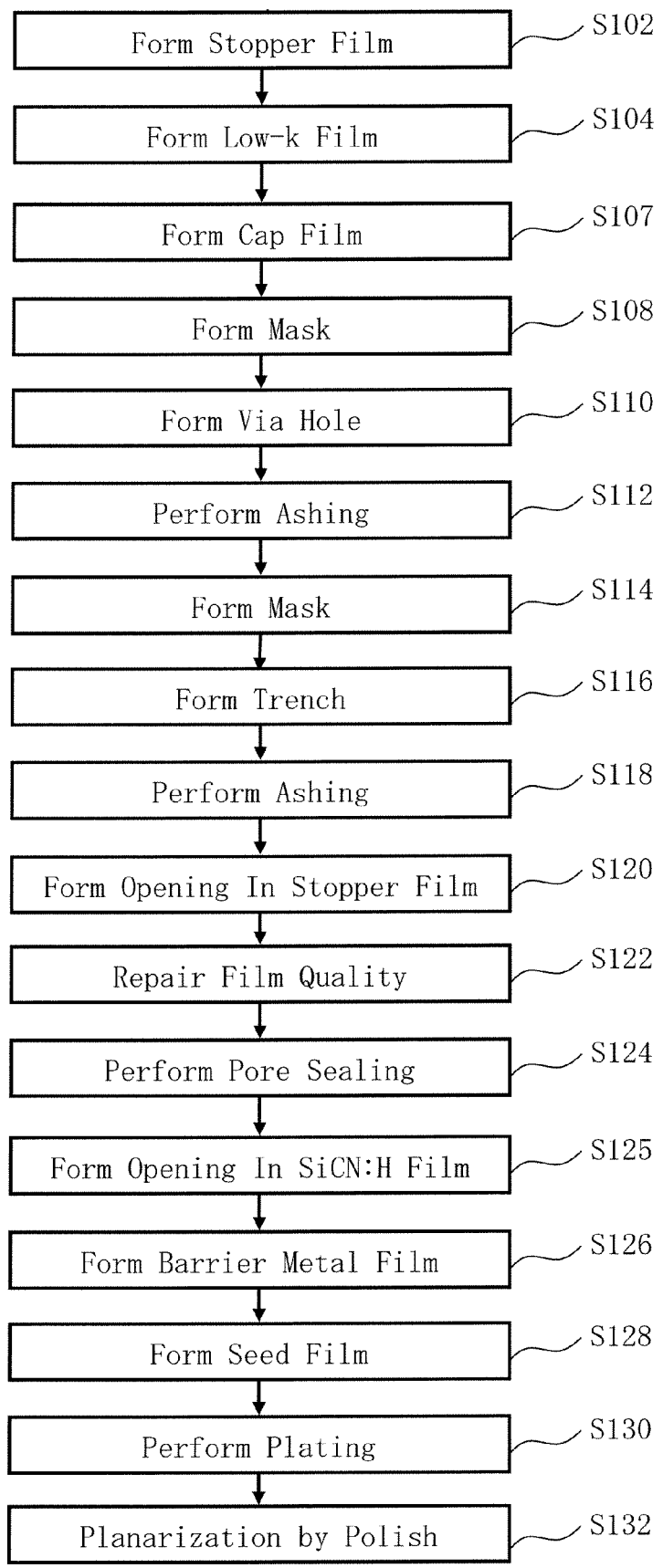
FIG. 1 is a flow chart showing principal parts of a method for fabricating a semiconductor device in a first embodiment.

A first embodiment will be described below using drawings. FIG. 1 is a flow chart showing principal parts of a method for fabricating a semiconductor device in the first embodiment. In FIG. 1, the present embodiment performs a series of processes including a stopper film formation process (S102) to form a stopper film, a low-k film formation process (S104) to form a low dielectric constant insulating material (low-k material) film, a cap film formation process (S107) to form a cap film, a mask formation process (S108) to form a mask, a via hole formation process (S110) to form a via hole, an ashing process (S112), a mask formation process (S114) to form a mask, a trench formation process (S116) to form a trench, an ashing process (S118), a stopper film opening process (S120), a film quality repair process (S122) to repair film quality, a pore sealing process (S124), a SiCN:H film opening process (S125), a barrier metal film formation process (S126), a seed film formation process (S128), a plating process (S130) as an example of a copper (Cu) film formation process to form a Cu film, and a polishing process (S132).

Figure 2A:
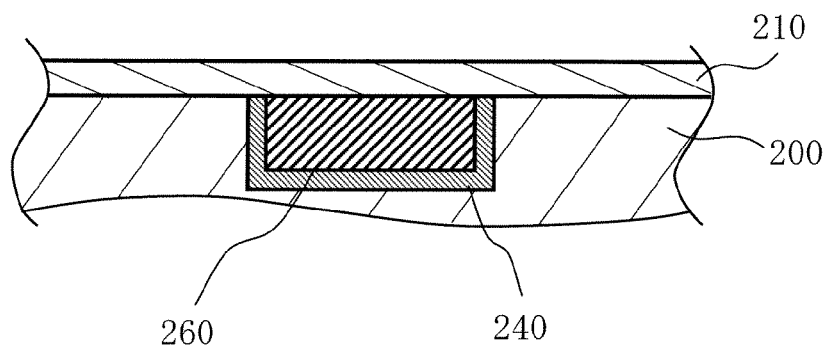
FIG. 2A to FIG. 2C are process sectional views showing processes performed corresponding to the flow chart of FIG. 1.
Figure 2B:
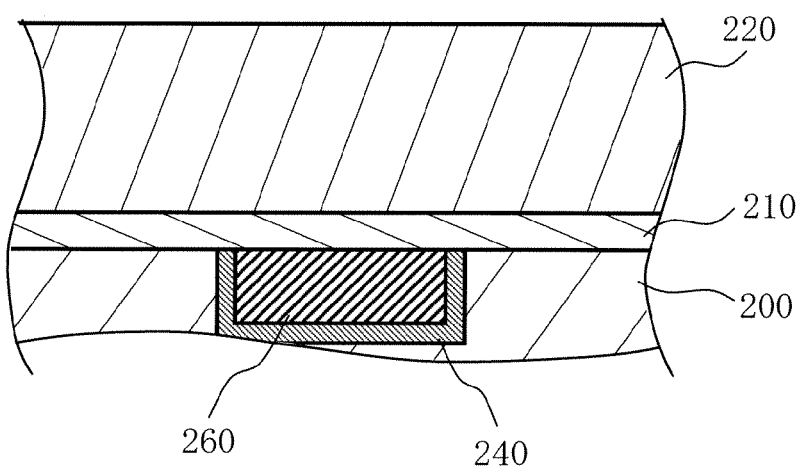
Figure 2C:
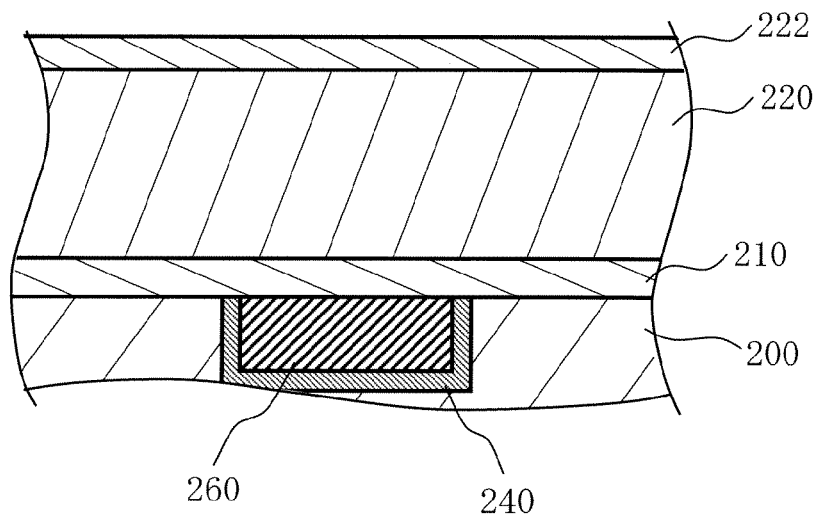

FIG. 2A to FIG. 2C are process sectional views showing processes performed corresponding to the flow chart of FIG. 1. FIG. 2A to FIG. 2C show from the stopper film formation process (S102) to the cap film formation process (S107) in FIG. 1.

In FIG. 2A, as the stopper film formation process, a silicon carbonitride (SiCN:H) film 210 containing hydrogen (H) to be an etching stopper film when forming a via hole is formed on a substrate 200 using the plasma CVD process. The SiCN:H film 210 of the thickness of 50 nm, for example, is deposited. At this point, organic silane (alkylsilane) and ammonia ($NH_3$) are used as source gases. Here, as an example, trimethylsilane, which is alkylsilane, and $NH_3$ are used in a ratio of 1:2 at 0.34 Pa·m³/s (200 sccm) and 0.67 Pa·m³/s (400 sccm) respectively. It is suitable to set the frequency therefor to 13.56 MHz, discharge power to 500 W, and pressure inside a plasma CVD device to $1.33 \times 10^3$ Pa (10 Torr). As the substrate 200, for example, a silicon wafer of 300 mm in diameter is used. Here, multi-layer wiring is assumed and a substrate having a dielectric film in which a Cu film 260 to be copper (Cu) wiring is already embedded is used for a description below. A barrier metal 240 is formed on the side and at the bottom of the Cu film 260 to prevent diffusion into the dielectric film. Here, formation of a plug portion leading to the Cu film 260 and devices on the substrate 200 is omitted.

In FIG. 2B, as the low-k film formation process to be an example of a insulating material film formation process, a thin film of a low-k film 220 of, for example, 350 nm in thickness using a porous low dielectric constant insulating material (low-k material) is formed on the SiCN:H film 210. Here, polymethyl siloxane (MSX) is used as material of the low-k film 220. A porous MSX film is a so-called low dielectric constant inter-layer dielectric film whose relative dielectric constant k is reduced below 3.9 to about 2.2. The low-k film 220 using MSQ is mainly structured around silicon (Si) bound to oxygen (O), but part of its structure is an organic structure in which the methyl group ($CH_3$) is substituted for oxygen (O). In addition to polymethyl siloxane, the low-k film 220 may be formed, for example, using at least one selected from a group consisting of a film having siloxane backbone structures such as polysiloxane, hydrogen silsesquioxane and methyl silsesquioxane, a film having as its main component organic resin such as polyarylene ether, polybenzo oxazole, and polybenzo cyclobutene, and a porous film such as a porous silica film. Using such material of the low-k film 220, a low dielectric constant of less than 2.5 can be obtained. For example, the SOD (spin on dielectric) coating process by which a thin film is formed by spin-coating a solution and then heat-treating the solution may be used. For example, a film can be formed by a spinner and then the wafer is baked on a hot plate in a nitrogen atmosphere and finally cured on the hot plate at a temperature higher than the baking temperature in the nitrogen atmosphere to form low-k film 220. A porous dielectric film having predetermined physical properties is obtained by suitably adjusting low-k material and formation conditions.

In FIG. 2C, as the cap film formation process, a thin film of a $SiO_2$ film 222 is formed by depositing silicon oxide ($SiO_2$) of, for example, 100 nm in thickness as a cap dielectric film on the low-k film 220 by the plasma CVD process. Here, organic silane (alkoxysilane) and oxygen ($O_2$) are used as source gases. Then, tetraethoxysilane, which is alkoxysilane, and $O_2$ are suitably used at 1.7 Pa·m³/s (1000 sccm) and 0.84 Pa·m³/s (500 sccm) respectively. It is suitable to set the frequency therefor to 13.56 MHz, discharge power to 800 W, and pressure inside the plasma CVD device to 0.67×10³ Pa (5 Torr).

Figure 3A:
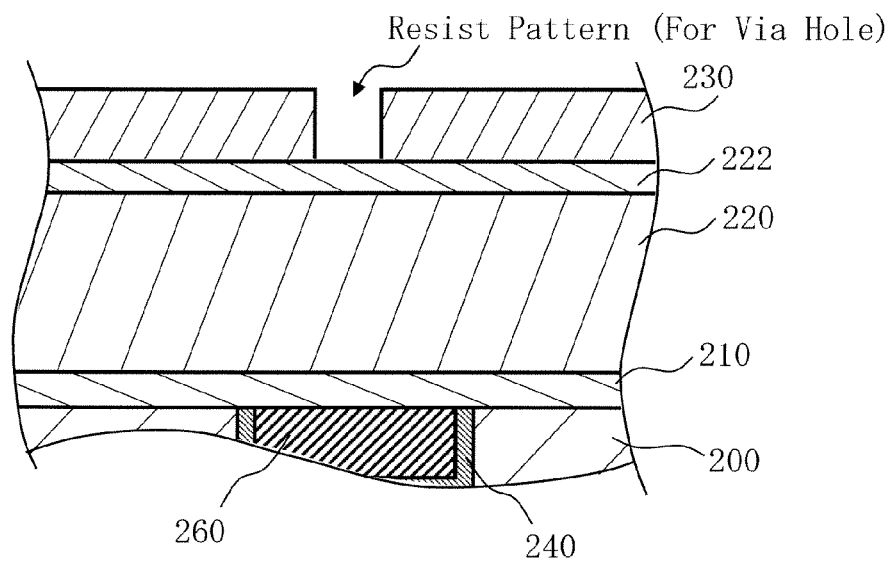
FIG. 3A to FIG. 3C are process sectional views showing processes performed corresponding to the flow chart of FIG. 1.
Figure 3B:
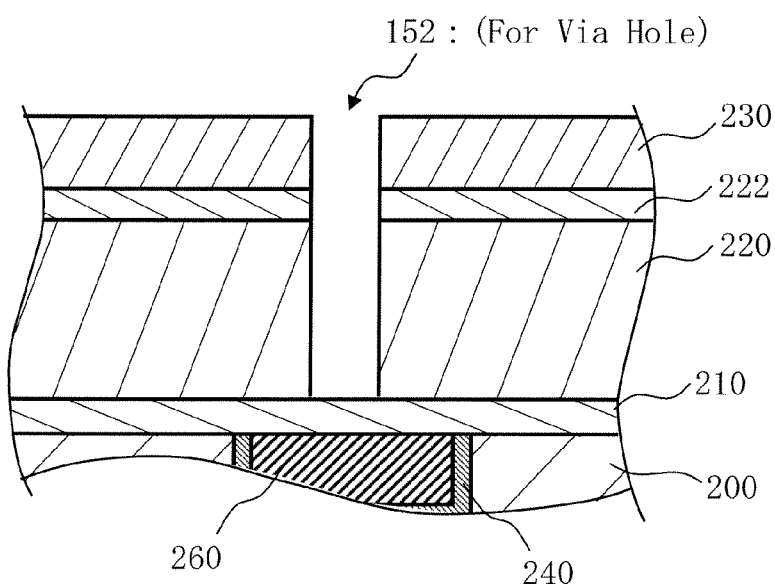
Figure 3C:
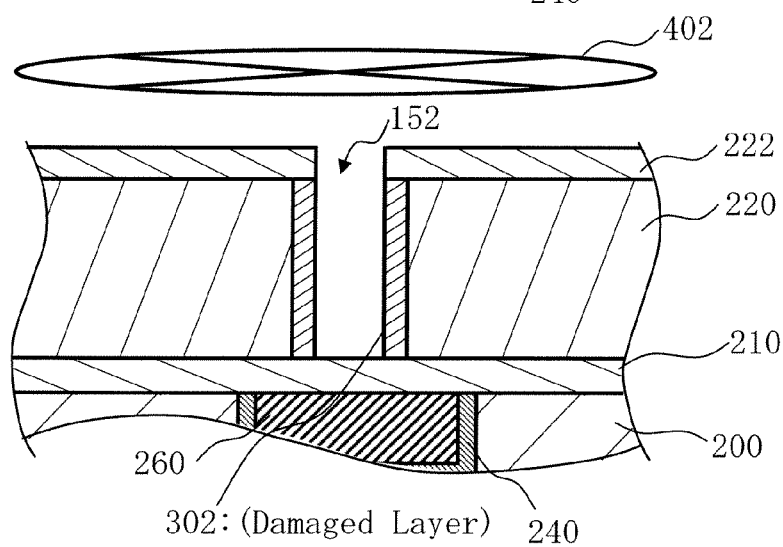

FIG. 3A to FIG. 3C are process sectional views showing processes performed corresponding to the flow chart of FIG. 1. FIG. 3A to FIG. 3C show from the mask formation process (S108) to the ashing process (S112) in FIG. 1.

In FIG. 3A, as the mask formation process, a resist film 230 is formed by coating the $SiO_2$ film 222 with resist material. Then, a pattern for via holes is exposed and developed by a lithography technology to form a resist pattern.

In FIG. 3B, as the via hole formation process to be an opening formation process, the $SiO_2$ film 222 and the low-k film 220 are processed by a dry etching technology using the resist film 230 as a mask. At this time, the SiCN:H film 210 is used as an etching stopper. An opening 152 to be a via hole for preparing damascene wiring is thereby formed in the low-k film 220. The reactive ion etching (RIE) process, which is an anisotropic dry etching technology, for example, is suitably used for processing. Then, a parallel-plate etching reactor using high frequencies may be used. The frequency therefor is set to 13.56 MHz and discharge power to 1 kW. Pressure inside the device is set to 13.3 Pa (100 mTorr) and a $CF_4$ gas of 0.17 Pa·m³/s (100 sccm) is suitably used as a gas. By using the anisotropic etching process, the opening 152 can be formed approximately at right angles to the surface of the substrate 200.

In FIG. 3C, as the ashing process, the resist film 230 used as a mask is separated by the same device as that used for via hole formation continuously under the same processing conditions except that only the gas is changed to $O_2$. With the low-k film 220 being exposed to an $O_2$ plasma 402 atmosphere in this way, the surface in contact with the atmosphere and its inside will be damaged. Here, the wall surface of the opening 152 will be oxidized by oxygen discharge. As a result, a damaged layer 302 to be a damaged portion will be formed.

FIG. 4A to FIG. 4C are process sectional views showing processes performed corresponding to the flow chart of FIG. 1. FIG. 4A to FIG. 4C show from the mask formation process (S114) to the ashing process (S118) in FIG. 1.

In FIG. 4A, as the mask formation process, the $SiO_2$ film 222 is coated with resist material to form a resist film 232. Then, this time a pattern for trench is exposed and developed by a lithography technology to form a resist pattern.

In FIG. 4B, as the trench formation process to be an opening formation process, the $SiO_2$ film 222 and the low-k film 220 are processed by the dry etching technology using the resist film 232 as a mask. An opening 154 to be a trench for preparing damascene wiring is thereby formed in the low-k film 220. The reactive ion etching (RIE) process, which is an anisotropic dry etching technology, for example, is suitably used for processing. Then, a parallel-plate etching reactor using high frequencies may be used. The frequency therefor is set to 13.56 MHz and discharge power to 1 kW. Pressure inside the device is set to 13.3 Pa (100 mTorr) and a $CF_4$ gas of 0.17 Pa·m³/s (100 sccm) is suitably used as a gas. By using the anisotropic etching process, the opening 154 can be formed approximately at right angles to the surface of the substrate 200.

In FIG. 4C, as the ashing process, the resist film 232 used as a mask is subsequently separated by the same device as that used for trench formation under the same processing conditions except that only the gas is changed to $O_2$. With the low-k film 220 being exposed to an $O_2$ plasma 404 atmosphere in this way, the surface in contact with the atmosphere and its inside will be damaged. Here, the wall surface of the opening 152 and the wall surface and bottom of the opening 154 will be oxidized by oxygen discharge. As a result, in addition to the damaged layer 302, a damaged layer 304 to be a damaged portion will be formed on the wall surface and at the bottom of the opening 154.

Figure 5A:
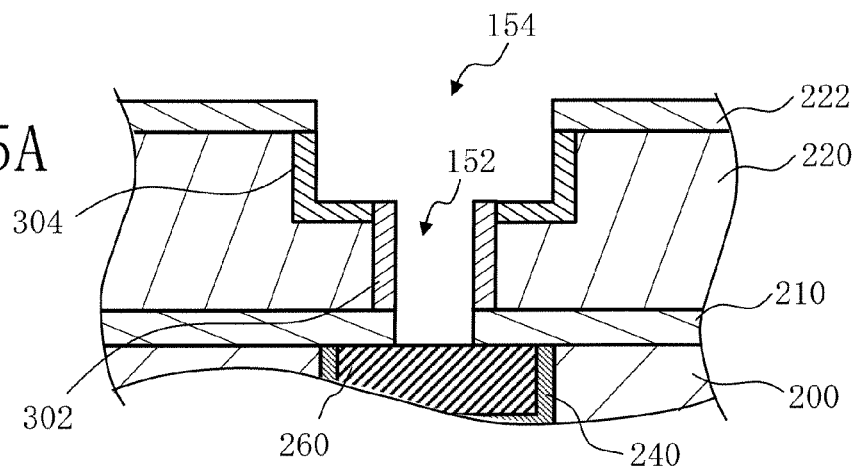
FIG. 5A to FIG. 5C are process sectional views showing processes performed corresponding to the flow chart of FIG. 1.
Figure 5B:
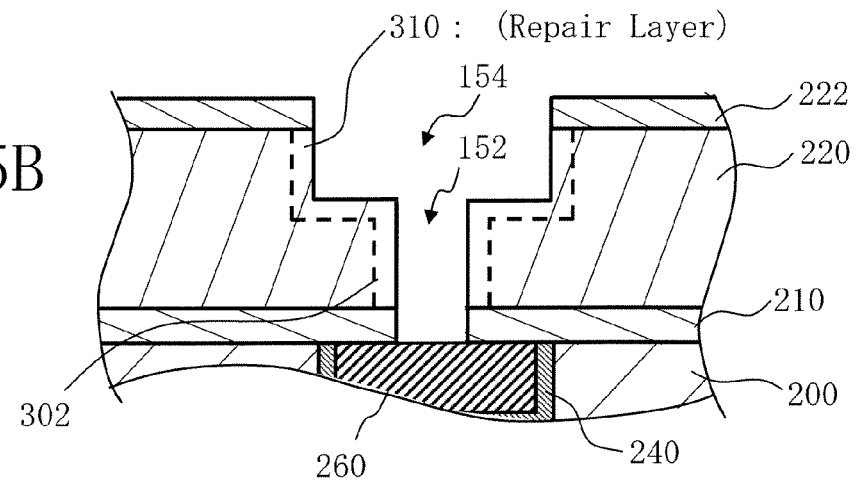
Figure 5C:
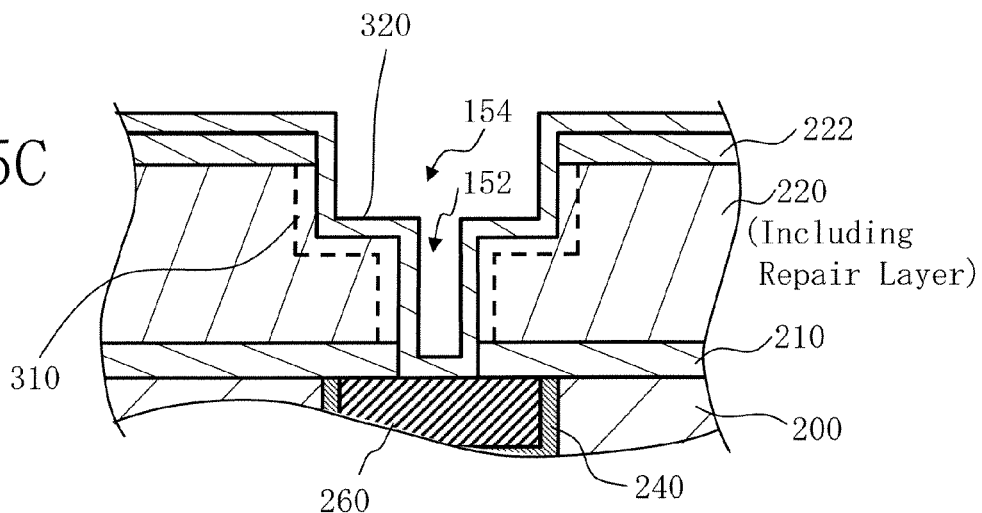

FIG. 5A to FIG. 5C are process sectional views showing processes performed corresponding to the flow chart of FIG. 1. FIG. 5A to FIG. 5C show from the stopper film opening process (S120) to the pore sealing process (S124) in FIG. 1.

In FIG. 5A, as the stopper film opening process, the SiCN:H film 210 at the bottom of the opening 152 is processed by the RIE process to finish embedded wiring groundwork. A parallel-plate etching reactor using high frequencies, for example, is used for processing. Then, a $CF_4/O_2$ mixed gas is flown at flow rates of 0.17 Pa·m³/s (100 sccm)/0.02 Pa·m³/s (10 sccm) respectively. The frequency therefor is 13.56 MHz and discharge power is 1 kW. Pressure inside the device is suitably set to 13.3 Pa (100 mTorr).

In the above processes, damaged layers are formed in an upper interface of the low-k film 220, on the side and at the bottom of the trench and on the side of the via hole by the cap film formation process (S107), ashing process (S112), ashing process (S118) and the like. In the first embodiment, particularly the damaged layer 304 on the side and at the bottom of the trench and the damaged layer 302 on the side of the via hole are illustrated. Each damaged layer is formed by the surface of the low-k film 220 exposed to an oxygen plasma atmosphere being oxidized by oxygen discharge in these processes. Since the low-k film 220 contains therein the methyl group, a reaction shown in the following reaction formula (1) is considered to occur:

$$\equiv Si-CH_3 + 2O_2 \rightarrow \equiv Si-OH + CO_2 + H_2O \quad (1)$$

Here, $CH_3$ in $\equiv Si-CH_3$ is the methyl group contained in the low-k film 220. Since the formed $\equiv Si-OH$ group acts as a so-called moisture absorption site adsorbing moisture ($H_2O$), particularly the damaged layer 302 in which moisture is adsorbed near metallic wires is formed. Thus, moisture oxidizes metallic wires particularly in a high-temperature heat treatment process or the like in downstream operations. Particularly, a barrier metal layer described later is oxidized.

Accordingly, reduced adhesion strength between the oxidized barrier metal layer and Cu wires will cause a failure, leading to degradation of wiring reliability. Particularly, metal in a wiring portion of the opening 152 to be a metal migration in a via hole, causing a disconnection failure. Thus, in the first embodiment, film quality of these damaged layers 302 and 304 is repaired.

In FIG. 5B, as the film quality repair process, a gas replacing the Si—OH group is fed for substitution of the damaged layers 302 and 304 formed on the surface of the opening 152 and the opening 154 to repair film quality.

Figure 6:
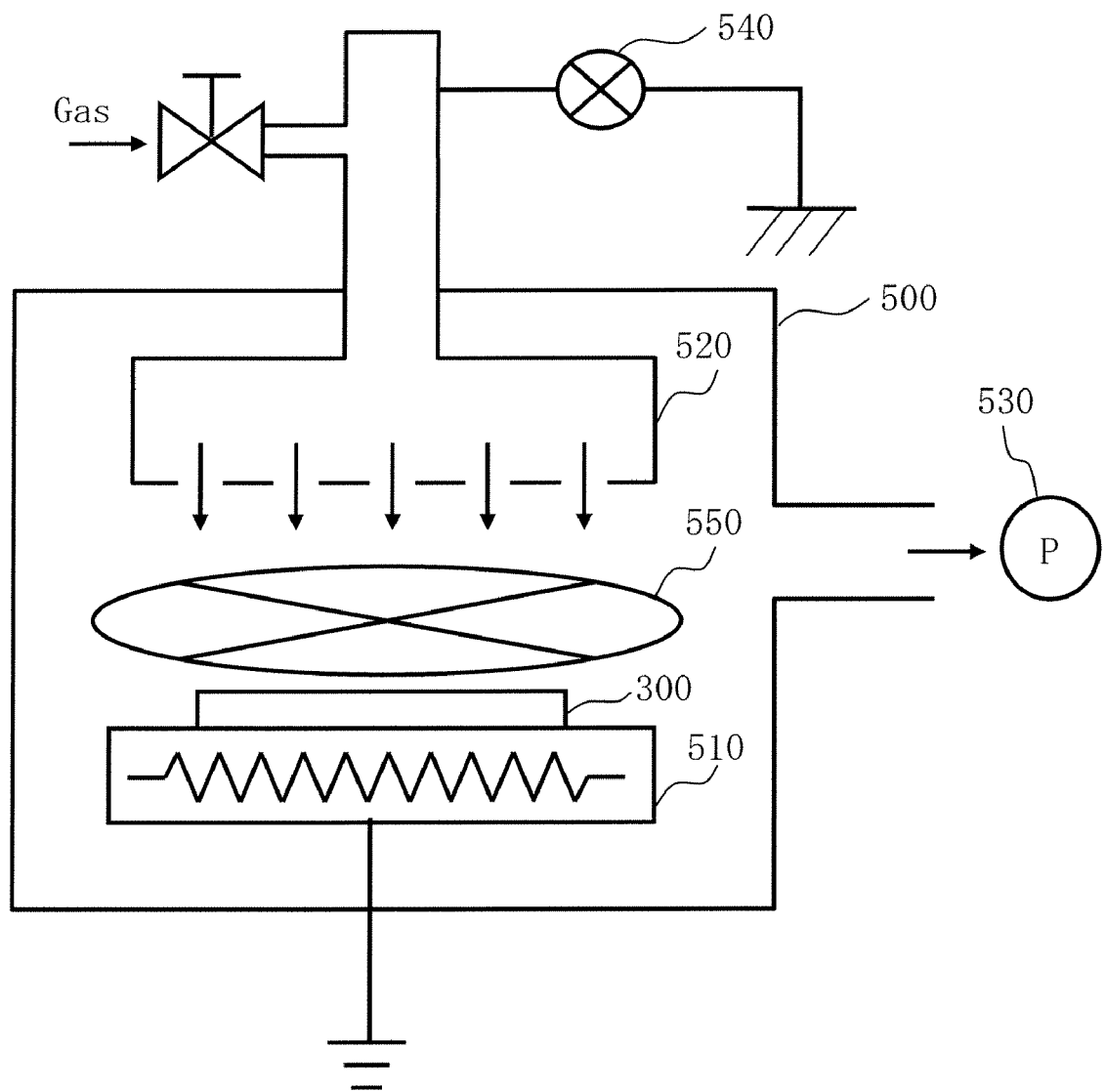
FIG. 6 is a conceptual diagram for illustrating a configuration of a device used for repairing film quality.

FIG. 6 is a conceptual diagram for illustrating a configuration of a device used for repairing film quality. In FIG. 6, a semiconductor substrate to be a base 300 is placed on a substrate holder 510 inside a chamber 500 to be a reactor. A gas having a Si—$R_1$ group to substitute for the Si—OH group is used. Here, as an example, a gas having at least the Si—$NH_2$ group is used. $(CH_3)_3SiNH_2$ can be used, for example, as a gas for repair. Then, the gas is fed into the chamber 500 through an upper electrode 520. The flow rate of fed gas is 0.84 Pa·m³/s (500 sccm). The upper electrode 520 has suitably a shower head structure. The gas can thereby be blown uniformly toward the base 300. Also, a vacuum pump 530 is used for evacuation to produce gas pressure of 1.33× 10³ Pa (10 Torr). The temperature of the base 300 is controlled to 250° C. by a heater installed in the substrate holder 510. Under such conditions, the base 300 is exposed to the gas having the Si—$NH_2$ group. A device in which a parallel-plane plasma discharge using high frequencies of 13.56 MHz can occur may be used as the chamber 500. However, the base 300 is exposed without using the plasma discharge in the film quality repair process.

As described above, the ≡Si—OH group is formed in the damaged layer and a problem is caused by moisture ($H_2O$) being absorbed by the ≡Si—OH group, but with exposure to a gas, a reaction shown in the following reaction formula 2 can be caused:

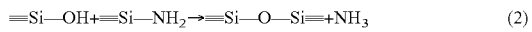

$$\equiv Si-OH + \equiv Si-NH_2 \rightarrow \equiv Si-O-Si \equiv + NH_3 \quad (2)$$

With the reaction shown in the reaction formula (2), the Si—OH bond disappears by substitution to restore resistance to hygroscopicity degraded by damage. FIG. 5B shows a repaired portion as a repair layer 310. $(CH_3)_3SiNH_2$ can penetrate deep into the porous low-k film 220 to effectively eliminate the ≡Si—OH bond in the film.

Figure 7A:
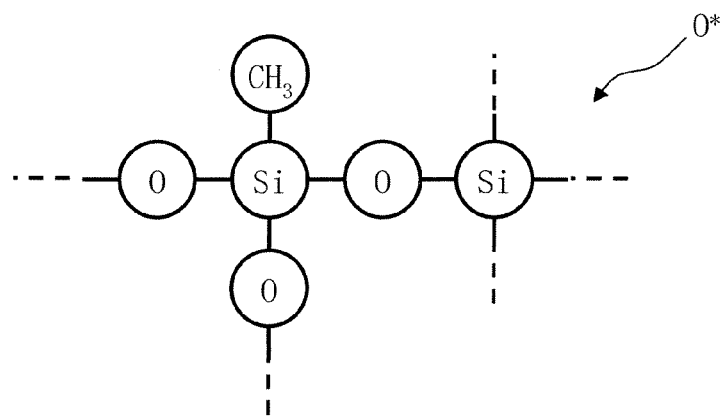
FIG. 7A to FIG. 7C are conceptual diagrams showing reactions when a damaged layer is formed until the damaged layer is repaired.
Figure 7B:
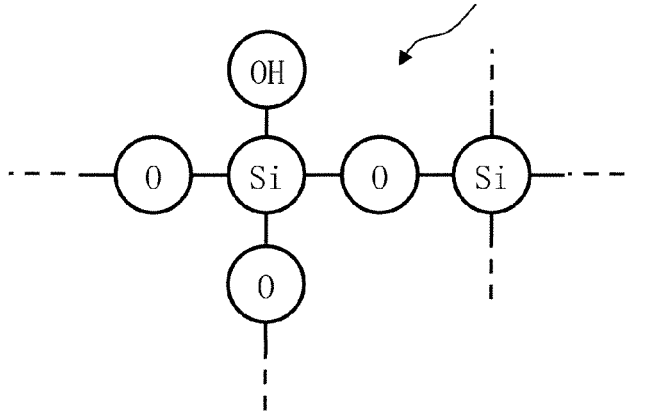
Figure 7C:
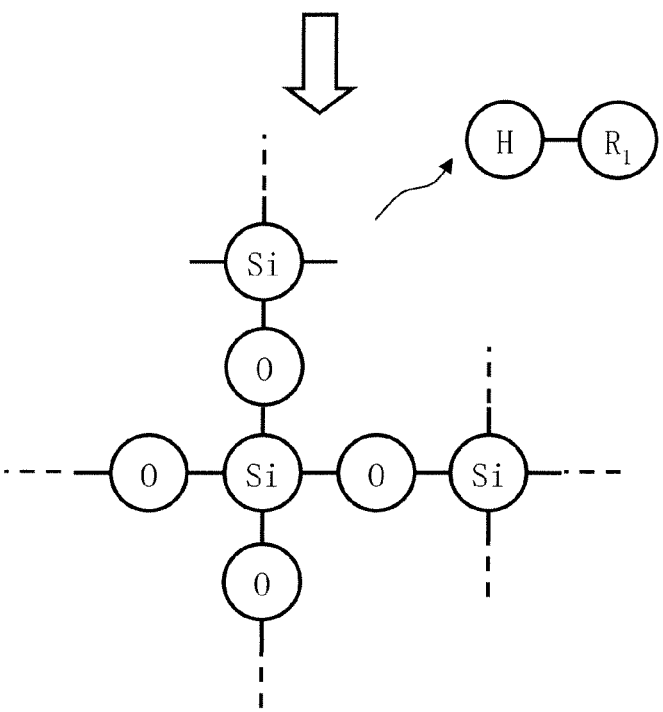

FIG. 7A to FIG. 7C are conceptual diagrams showing reactions when a damaged layer is formed until the damaged layer is repaired. First, as shown in FIG. 7A, ≡Si—$CH_3$ is oxidized by being exposed to radical oxygen atom O* and, as shown in FIG. 7B, the ≡Si—OH group is formed. A gas having the Si—$R_1$ group is fed therein. As a result, as shown in FIG. 7C, the OH group is replaced and repairs are made to the Si—O—Si bond. Hydrogen (H) in the OH group is bound to the $R_1$ group before being separated from the structure of the low-k film 220. With the reaction described above, film quality of the surface of the low-k film 220 can be repaired.

Here, pores are exposed on the surface of the low-k film 220 inside the openings 152 and 154 even after the damaged layer is repaired because the low-k film 220 is a porous film. Thus, when a barrier metal film is formed in a subsequent process, the barrier metal may not be able to fill in all pores, causing layer discontinuity before and after a pore. If such a discontinuous barrier metal film is formed, Cu is diffused from Cu wires into the low-k film 220, causing a wiring failure. Thus, in the first embodiment, pore sealing is further performed to close such pores.

In FIG. 5C, as the pore sealing process, after film quality of the damaged layer is repaired, as described above, pore sealing on the surface inside the openings 152 and 154 is subsequently performed using the same gas and the same device as those used for film quality repairs. Under the process conditions of the film quality repair process, the introduced gas $(CH_3)_3SiNH_2$ reacts very rarely and a reaction with each other seldom occurs. Then, subsequently, a high-frequency power supply 540 of 13.56 MHz shown in FIG. 6 is used to allow a discharge inside the reactor. Discharge power may be 500 W. Other conditions are the same as the process conditions of the film quality repair process. Plasma 550 can thereby be generated. A SiCN:H film 320 is deposited on the substrate as a pore sealing film by a reaction of $(CH_3)_3SiNH_2$ with each other caused by the discharge. That is, the SiCN:H film 320 can be formed on the wall surface and at the bottom inside the openings 152 and 154 and on the $SiO_2$ film 222. In the pore sealing process, as described above, a higher level of energy is fed than in the film quality repair process.

FIG. 8A and FIG. 8B are conceptual diagrams for illustrating pore sealing.

If no pore sealing is performed, as shown in FIG. 8A, a barrier metal film 242 may become discontinuous due to a pore 221 on the surface of the low-k film 220. In contrast, as shown in FIG. 8B, the SiCN:H film 320 is deposited on the surface of the low-k film 220 inside the openings 152 and 154. Then, the exposed pore 221 is closed. Accordingly, morphology on the surface degraded by a cavity of the exposed pore 221 is restored so that the surface can be changed to a smooth one. This is due to an effect of closing the cavity that has existed on the surface by SiCN:H. An effect of closing a cavity can already be gained when the thickness of SiCN:H film is about 2 nm, but it is desirable to deposit 5 nm or thicker of the SiCN:H film. With the above operations, the barrier metal film 242 can be formed continuously with stability.

Figure 9A:
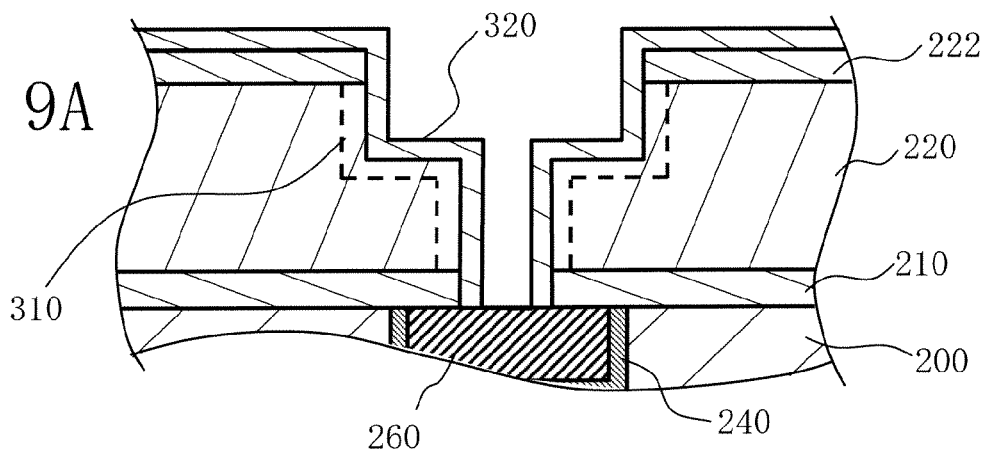
FIG. 9A to FIG. 9C are process sectional views showing processes performed corresponding to the flow chart of FIG. 1.
Figure 9B:
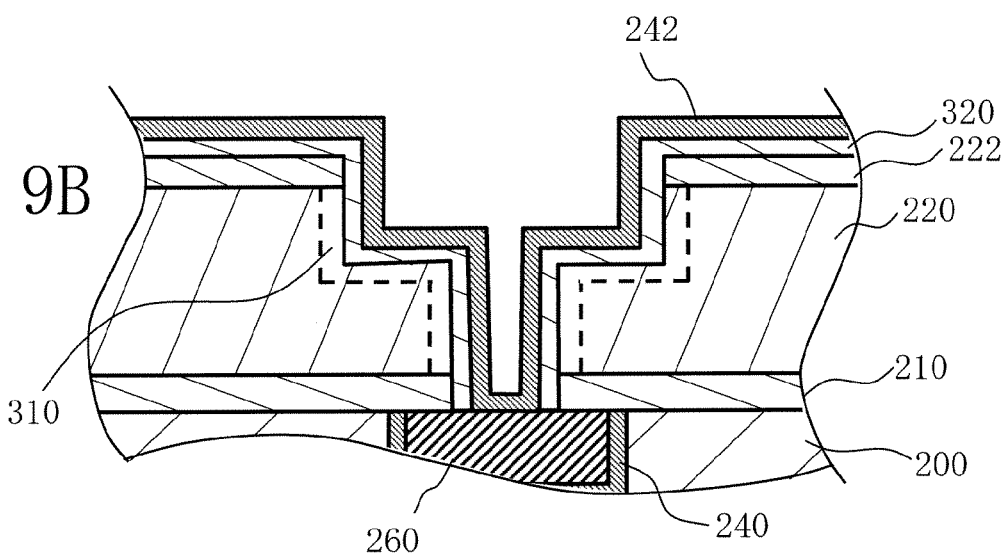
Figure 9C:
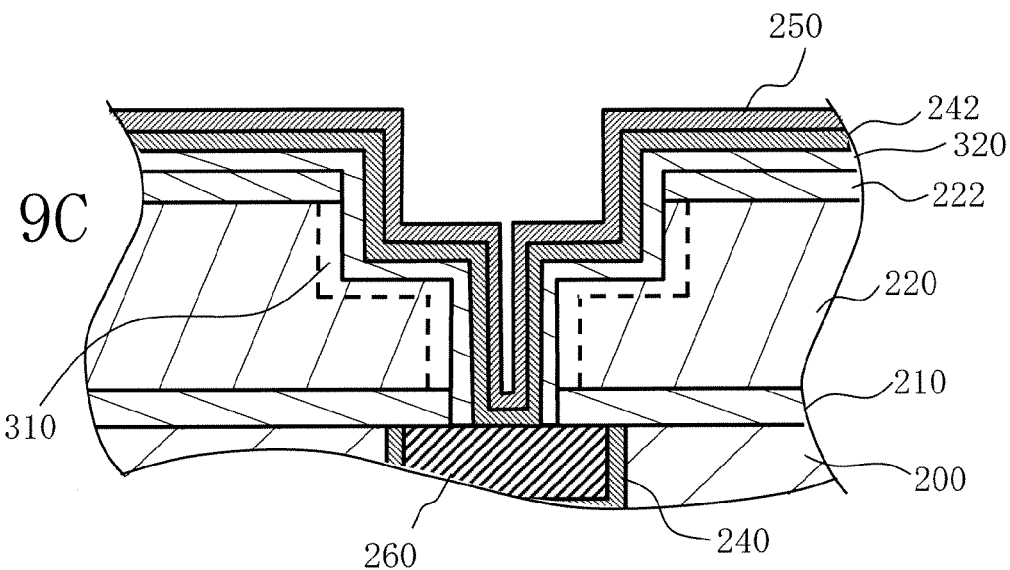

FIG. 9A to FIG. 9C are process sectional views showing processes performed corresponding to the flow chart of FIG. 1. FIG. 9A to FIG. 9C show from the SiCN:H film opening process (S125) to the seed film formation process (S128) in FIG. 1.

In FIG. 9A, as the SiCN:H film opening process, only the SiCN:H film 320 deposited on the surface of the Cu film 260 at the bottom of the opening 152 to be a via hole is removed by the dry etching technology while leaving the SiCN:H film 320 on the side wall intact.

In FIG. 9B, as the barrier metal film formation process, the barrier metal film 242 using barrier metal material is formed inside the formed openings 152 and 154 and on the surface of the SiCN:H film 320. The barrier metal film 242 is formed by depositing a thin film of a tantalum nitride (TaN) of, for example, 10 nm in thickness in a sputtering device using a sputter process, which is a kind of the physical vapor deposition (PVD) process. The deposition method of barrier metal material is not limited to the PVD process and the atomic layer deposition (ALD) process, the atomic layer chemical vapor deposition (ALCVD) process, or the CVD process maybe used. Using these processes, a higher coverage rate can be achieved than in the PVD process. In addition to TaN, material of the barrier metal film includes tantalum (Ta), tungsten (W), titanium (Ti), titanium nitride (TiN), tungsten nitride (WN), and a laminated film combining, for example, Ta and TaN.

In FIG. 9C, as the seed film formation process, a thin film of Cu to be a cathode electrode in the next process, the electrolytic plating process, is deposited (formed) as a seed film 250 by the PVD process such as the sputter process inside the openings 152 and 154 and on the low-k film 220 where the barrier metal film 242 has been formed. Here, the seed film 250 of the thickness of 50 nm, for example, is deposited.

Figure 10A:
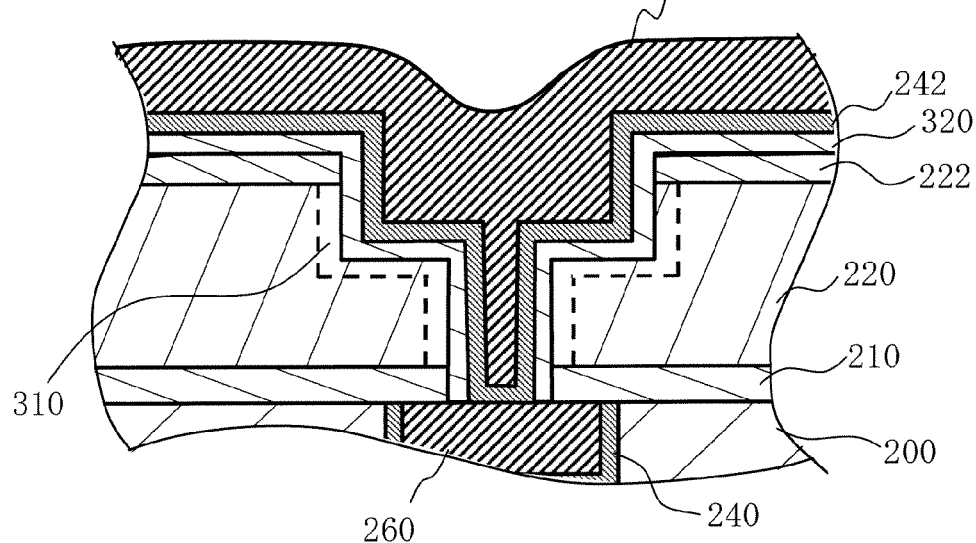
FIG. 10A and FIG. 10B are process sectional views showing processes performed corresponding to the flow chart of FIG. 1.
Figure 10B:
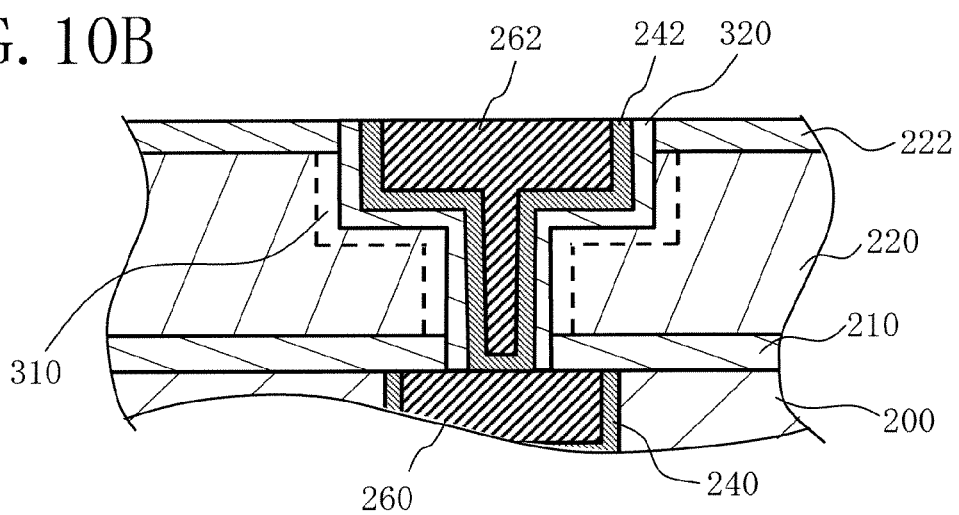

FIG. 10A and FIG. 10B are process sectional views showing processes performed corresponding to the flow chart of FIG. 1. FIG. 10A and FIG. 10B show from the plating process (S130) to the polishing process (S132) in FIG. 1.

In FIG. 10A, as the plating process, with the seed film 250 as the cathode electrode, a thin film of a Cu film 262 is deposited inside the openings 152 and 154 and on the low-k film 220 by an electrochemical deposition process such as the electrolytic plating. Here, for example, the Cu film 262 of the thickness 1200 nm is deposited and after deposition, annealing is performed, for example, at 250° C. for 30 minutes.

In FIG. 10B, as the polishing process, the surface of the substrate 200 having the Cu film 262 formed thereon is polished according to the CMP method for planarization by polishing/removing the Cu film 262 including the seed film 250, the barrier metal film 242, and the SiCN:H film 320 deposited on the surface of the low-k film 220 in addition to the openings 152 and 154 to form an embedded structure to be Cu wiring shown in FIG. 10B.

In the first embodiment, as has been described above, damaged layer repairs and pore sealing are performed in the same vessel using the same gas. Accordingly, compared with conventional processes in which processing is performed in different devices using different gases, a single device is used for processing in a shorter time with a reduced number of processes. Also, according to the methods described above, the Si—OH group formed in a low dielectric constant film can be made to disappear and further morphology of the surface can be planarized. Then, by making the Si—OH group disappear, deterioration of reliability of wiring caused by an influence of oxidization of the barrier metal layer due to moisture contained in a side wall damaged portion can be inhibited. Also, with planarization of morphology of the surface, barrier metal formation can be controlled. As a result, occurrences of wiring failure can greatly be inhibited.

An effect of reducing the rate of occurrence of failure when the method shown in the first embodiment is used was verified by performing an accelerated test, which is a technique in the field of reliability technology. First, a semiconductor device manufactured by using a conventional method in which neither damaged layer repairs nor pore sealing is performed and that formed by using the method according to the first embodiment were heated in a nitrogen atmosphere at 225° C. and normal atmospheric pressure. Then, occurrence frequencies of disconnection failure of wiring were measured using an increase in wire resistance as a guide. As a result, while the fraction defective of semiconductor device manufactured by the method according to the first embodiment was 0.3% even after 1000 hours, that of semiconductor device manufactured by the conventional method reached 75%. These results verify that the method according to the first embodiment is extremely effective.

$(CH_3)_3SiNH_2$ was used as a gas in the first embodiment, but the present invention is not limited to this and a similar effect was verified for gases containing a group that reacts with the Si—OH group in a low dielectric constant film such as the Si—NRR' group (R and R' are selected from H or alkyl group such as $CH_3$) and the Si—OR'' group (R'' is selected from alkyl group such as $CH_3$). The alkoxysilane class includes $Si(OCH_3)_4$ (sometimes called TMOS), $CH_3Si(OCH_3)_3$, $(CH_3)_2Si(OCH_3)_2$ (sometimes called DMDMOS), $Si(OC_2H_5)_4$ (sometimes called TEOS), $CH_3Si(OC_2H_5)_3$, $(CH_3)_2Si(OC_2H_5)_2$, $(CH_3O)_3SiCH=CH_2$ (sometimes called VTMOS), $(C_2H_5O)_3SiCH=CH_2$ (sometimes called VTEOS), and $(CH_3COO)_3SiCH=CH_2$. The silazane class includes $(Me_3Si)_2NH$ (sometimes called HMDS), $HMe_2SiNEt_2$ (sometimes called DMSDEA), $(HMe_3Si)_2NH$ (sometimes called TMDS), $Me_3SiNMe_2$ (sometimes called TMSDMA), $HMe_2SiNMe_2$ (sometimes called DMSDMA), $Me_3SiNEt_2$ (sometimes called TMSDEA), $O=C(NH-SiMe_3)_2$ (sometimes called BTSU), $(Me_2N)_2SiHMe$ (sometimes called B[DMA]MS), $(Me_2N)_2SiMe_2$ (sometimes called B[DMA]DS), $(SiMe_2NH)_3$ (sometimes called HMCTS), $SiMe_3SiMe_2NMe_2$ (sometimes called DMAP-MDS), $SiH_2MeSiHMeNMe_2$ (sometimes called DMAD-MDS), Disila-aza-cyclopentane (sometimes called TDACP), and Disila-oxa-cyclopentane (sometimes called TDOCP). Further, the alkylsilane halide class includes $(CH_3)_3SiCl$ (sometimes called TMCS) and $(C_2H_5)_3SiCl$ (sometimes called TECS). In the above chemical formulas, Me denotes the methyl group and Et denotes the ethyl group.

Further, even if an organic film that could generate the C—OH group in a damaged portion is formed as a low dielectric constant film, it is expected that these gases react with the C—OH group to contribute to repairs of film quality in the damaged portion. The SiCN:H film 320 was formed by the discharge after repairs, but a similar effect can be gained by forming a SiC:H film, a SiCO:H film, or a SiOCN:H film.

In the first embodiment, a thermal reaction was used as a repair reaction and a reaction using plasma caused by a discharge was used as a film formation reaction for pore sealing to control the repair reaction and the film formation reaction for pore sealing. However, the control method is not limited to this. Reactions may be controlled, for example, by using temperature variations, pressure variations, addition of a new gas, or variations of irradiation of energy rays such as ultraviolet rays and electron beams. As a method of adding a new gas, for example, a film formation reaction for pore sealing could be caused by adding $NH_3$ as an additive gas. Also, as a method of electron beam irradiation, a film formation reaction for pore sealing could be caused with chamber internal pressure set to 133 Pa (1 Torr) for curing by electron beams, the current value of electron beams set to 10 mC/min and incident energy set to 5 kV. Moreover, about 5 minutes were suitable for causing such reactions. As a method of curing by ultraviolet rays, the pressure for curing was set to normal atmospheric pressure and a high-pressure mercury-vapor lamp of 5 kW was used. A film formation reaction could be caused by setting the substrate temperature therefor to 400° C. The suitable cure time was about 5 minutes. For heat treatment, setting the substrate temperature to 400° C. was effective in causing a film formation reaction. Setting the heat treatment time to about 30 minutes was suitable.

Second Embodiment

In the first embodiment, the manufacturing method for a semiconductor device was described by focusing on repairs of a damaged layer and pore sealing. In a second embodiment, a manufacturing method for a semiconductor device will be described by focusing on repairs of a damaged layer, improvement of mechanical strength, and improvement of plasma resistance.

Figure 11:
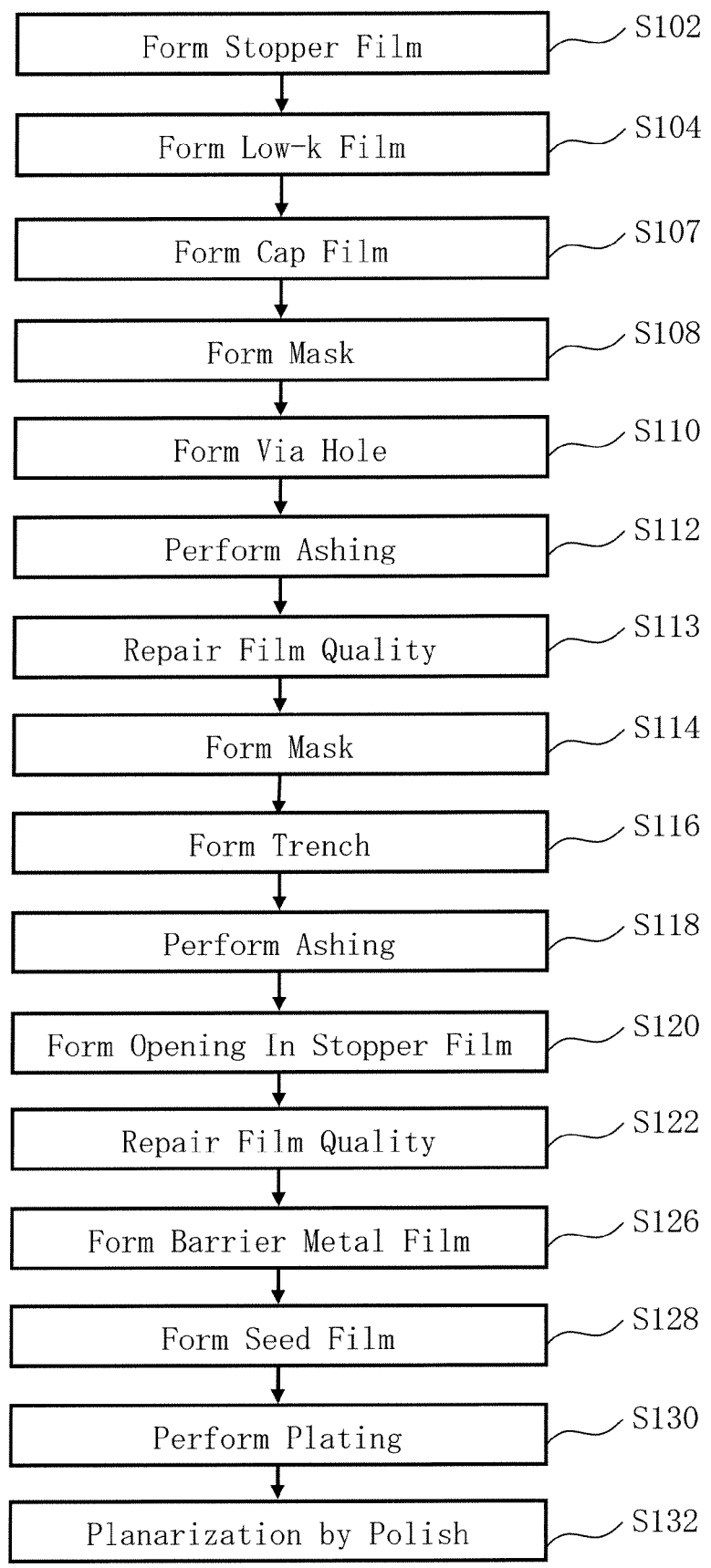
FIG. 11 is a flow chart showing principal parts of a manufacturing method for a semiconductor device in a second embodiment.

FIG. 11 is a flow chart showing principal parts of a method for fabricating a semiconductor device in the second embodiment. In FIG. 11, the second embodiment performs a series of processes including the stopper film formation process (S102) to form a stopper film, the low-k film formation process (S104) to form a low dielectric constant insulating material (low-k material) film, the cap film formation process (S107) to form a cap film, the mask formation process (S108) to form a mask, the via hole formation process (S110) to form a via hole, the ashing process (S112), a film quality repair process (S113) to repair film quality, the mask formation process (S114) to form a mask, the trench formation process (S116) to form a trench, the ashing process (S118), the stopper film opening process (S120), the film quality repair process (S122) to repair film quality, the barrier metal film formation process (S126), the seed film formation process (S128), the plating process (S130) as an example of a copper film formation process to form a Cu film, and the polishing process (S132). FIG. 11 is the same as FIG. 1 except that the film quality repair process (S113) is added between the ashing process (S112) and the mask formation process (S114) and the pore sealing process (S124) and the SiCN:H film opening process (S125) have been removed.

Processes from the stopper film formation process (S102) to the ashing process (S112) are the same as those in the first embodiment. Thus, as shown in FIG. 3C, the damaged layer 302 is formed on the wall surface inside the opening 152 for a via hole. Here, if the opening 154 to be a trench is further formed, a portion of the wall surface of the opening 152, that is, the wall surface in a portion to be a via hole will be exposed to oxygen plasma twice by two ashing processes of the ashing process (S112) and the ashing process (S118). Thus, the wall surface in a portion to be a via hole will be more damaged. Therefore, in the second embodiment, when the damaged layer 302 is formed in the first ashing process (S112), the damaged layer 302 is repaired.

Figure 12A:
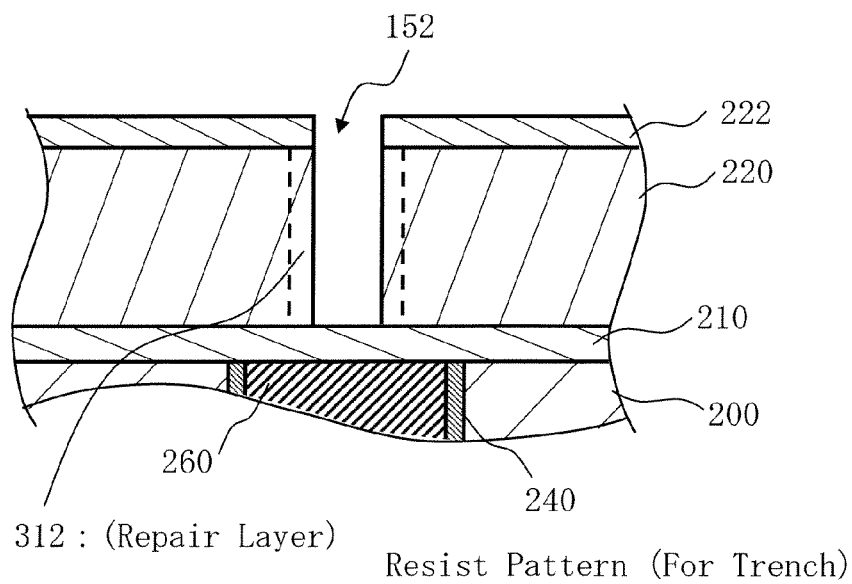
FIG. 12A to FIG. 12C are process sectional views showing processes performed corresponding to the flow chart of FIG. 11.
Figure 12B:
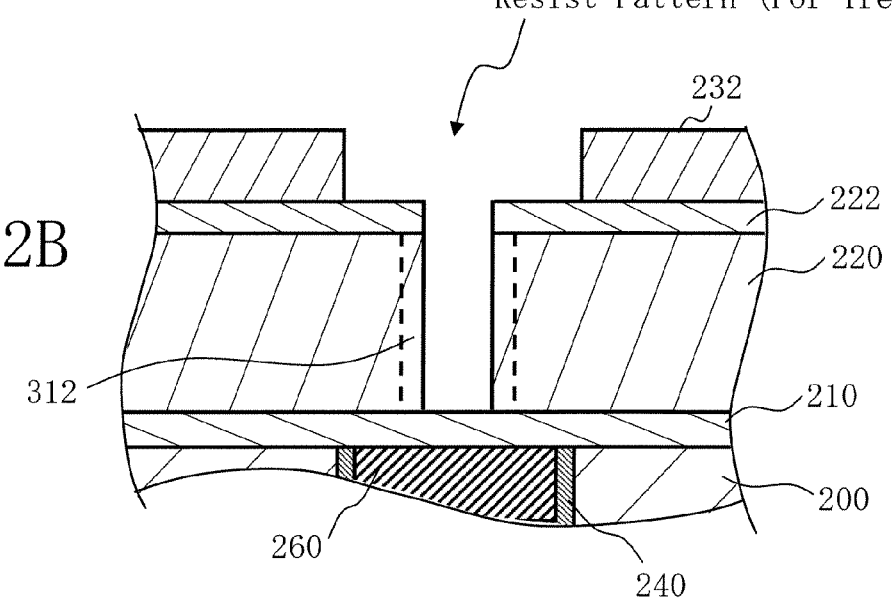
Figure 12C:
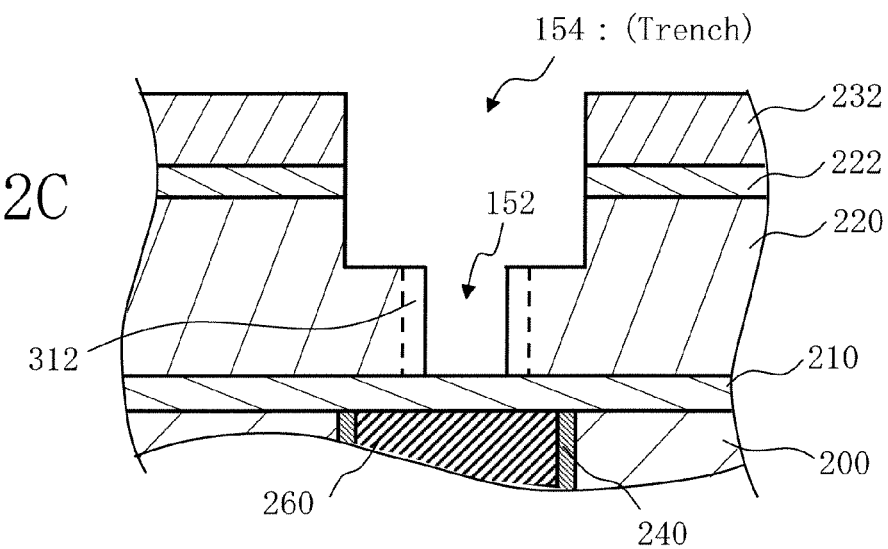

FIG. 12A to FIG. 12C are process sectional views showing processes performed corresponding to the flow chart of FIG. 11. FIG. 12A to FIG. 12C show from the film quality repair process (S113) to the trench formation process (S116).

In FIG. 12A, as the film quality repair process, a material replacing the Si—OH group is generated for substitution of the damaged layer 302 formed on the surface of the opening 152 to repair film quality. At this time, material containing the Si—C—Si group is used as material for substitution. As has been described above, the Si—OH group is formed in the damaged layer 302. Thus, a precursor having, for example, the Si—NH$_2$ group that replaces the Si—OH group and also having the Si—C—Si bond is made to react with the Si—OH group. Here, as an example, Si(CH$_3$)$_2$NH$_2$SiCH$_2$Si(CH$_3$)$_2$NH$_2$ is used. This material has a molecular structure shown below.

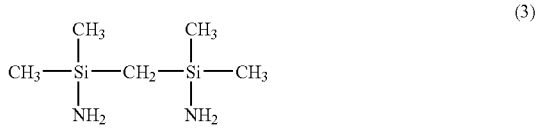

(3)

Like the first embodiment, the Si—NH$_2$ group in this material reacts with the Si—OH group formed in the film, as shown in the reaction formula 2 to replace the OH group. Then, repairs of the Si—OH bond are made to the Si—O—Si bond. At this point, NH$_3$ is generated.

Figure 13:
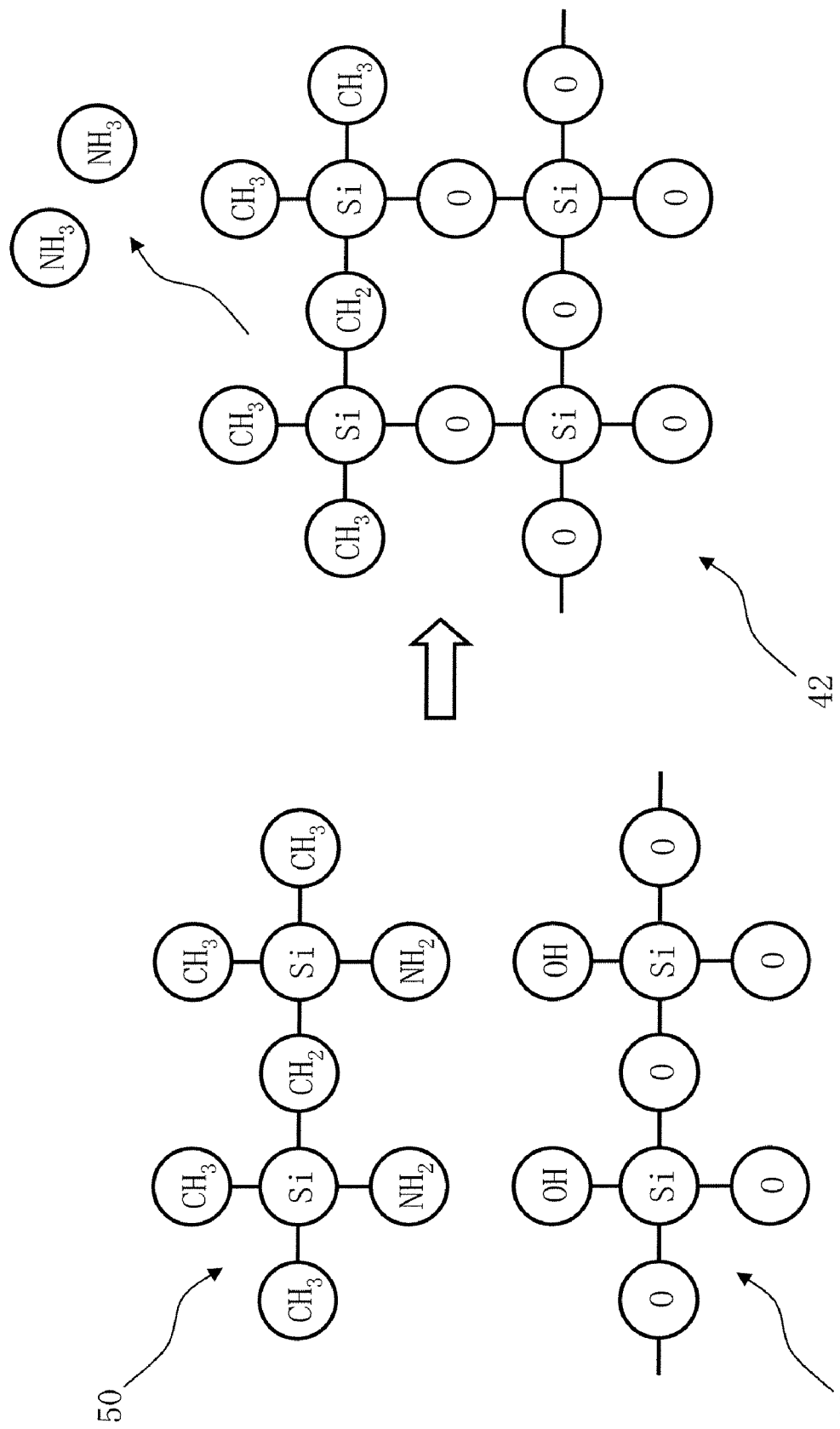
FIG. 13 is a conceptual diagram showing a repair reaction in the second embodiment.

FIG. 13 is a conceptual diagram showing a repair reaction in the second embodiment.

Material shown in a molecular structure 50 is fed to a molecular structure 40 generated in the damaged layer 302. As a result, the damaged layer 302 is repaired like a molecular structure 42 by replacing the OH group. That is, Si in the damaged layer 302 is repaired to the Si—O—Si bond. Further, material shown in the molecular structure 50 has the Si—C—Si bond and therefore, the Si—C—Si bond can be incorporated into a repaired repair layer 312. At this time, since the porous low-k film 220 has been formed, material shown in the molecular structure 50 penetrates deep inside the damaged layer 302 to form the thick repair layer 312.

Figure 14:
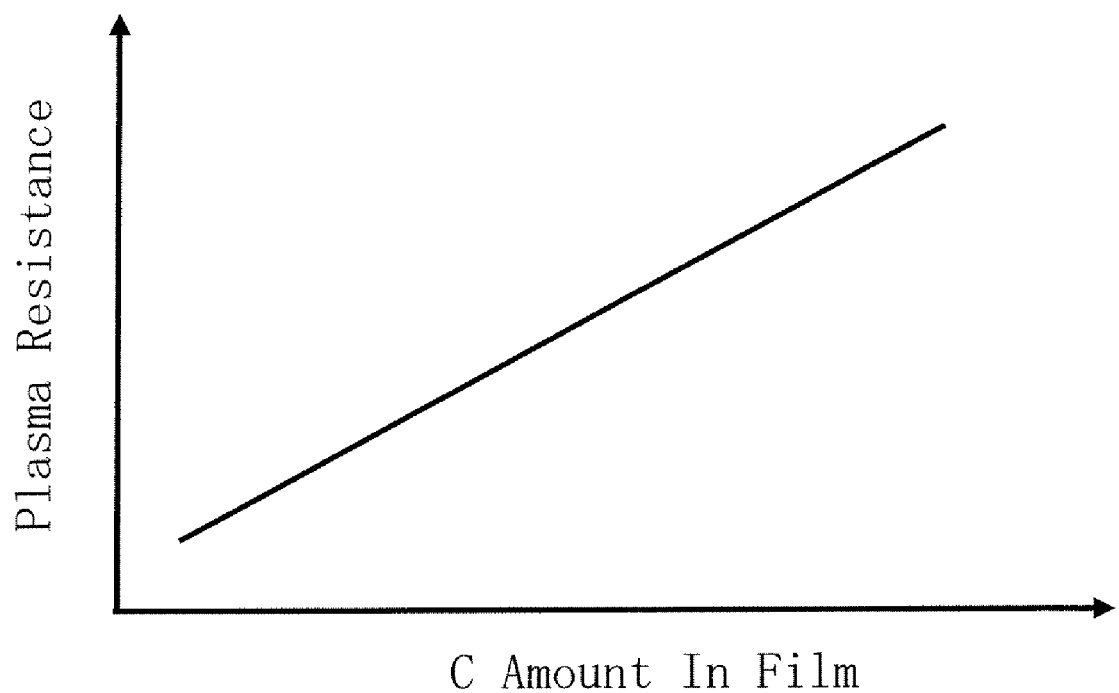
FIG. 14 is a diagram showing a relationship between plasma resistance and a C amount in a film.

FIG. 14 is a diagram showing a relationship between plasma resistance and a C amount in a film. As shown in FIG. 14, it is clear that plasma resistance improves as the amount of carbon (C) in the low-k film 220 increases. Also, the low-k film 220 has a problem of reduced mechanical strength as the relative dielectric constant decreases. A conventional low dielectric constant film has basic backbone structures of Si—O—Si and, if Si—C—Si backbone structures can be incorporated, mechanical strength can be improved. Since vapor pressure of a precursor having Si—C—Si is extremely low, it has been difficult to use the precursor simply as a source gas of CVD, but like the second embodiment, the Si—C—Si bond can be incorporated into the film by using, for example, Si(CH$_3$)$_2$NH$_2$SiCH$_2$Si(CH$_3$)$_2$NH$_2$.

Figure 15:
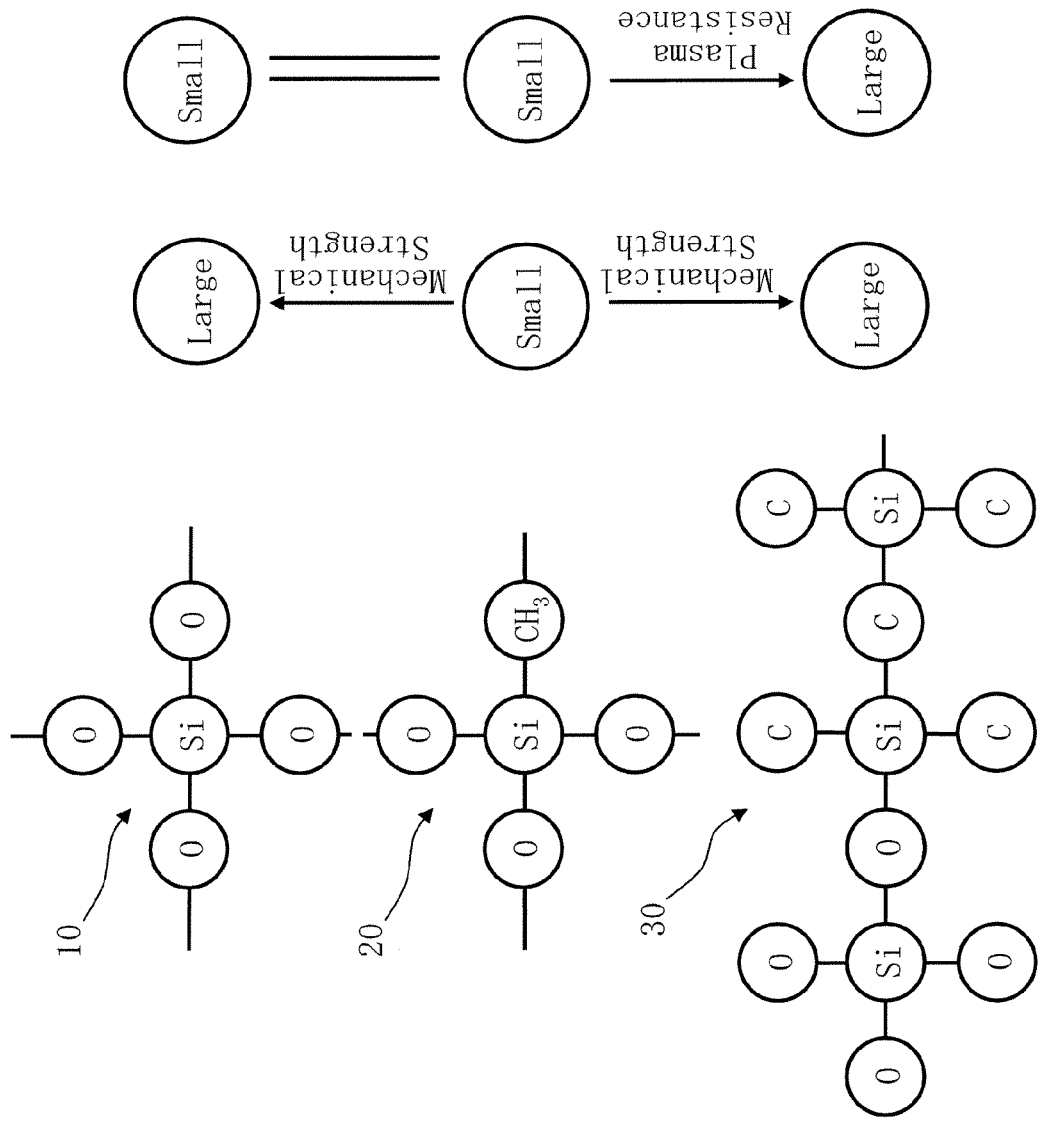
FIG. 15 is a diagram exemplifying comparison of plasma resistance and mechanical strength depending on differences in backbone structures of inter-layer dielectric films.

FIG. 15 is a diagram exemplifying comparison of plasma resistance and mechanical strength depending on differences in backbone structures of inter-layer dielectric films. The low-k film 220 constructed like a molecular structure 20 in which a methyl group is bound to Si through one bond is inferior in mechanical strength to a molecular structure 10 in which four bonds of Si are bound by Si—C—Si as basic backbone structures like a conventional inter-layer dielectric film. In contrast, a molecular structure 30 in which the Si—O—Si is incorporated like the second embodiment can improve in its mechanical strength. Moreover, with an increase in C amount, plasma resistance can be improved.

Here, as a method of feeding material having the Si—NH$_2$ group and also the Si—C—Si group, for example, a method of feeding such material as a gas and that of feeding as a chemical solution dissolved in an organic solvent can be mentioned. Here, the method of feeding as a chemical solution is used. A chemical solution may be fed by soaking a substrate in the chemical solution, but here, the spin-coat method is used to cause a reaction by dropping a dissolved organic solvent onto a semiconductor substrate being rotated. Then, by baking the semiconductor substrate at 350° C. while irradiating the semiconductor substrate with electron beams, the Si—C—Si bond can be incorporated into the film. Pressure for curing by electron beams is suitably set to 133 Pa (1 Torr), the current value to 10 mC/min, and incident energy to 5 kV. The irradiation time is suitably 5 minutes. A typical reaction during irradiation is as shown in FIG. 13.

In FIG. 12B, as the mask formation process, the resist film 232 to be a trench resist pattern is formed on the SiO$_2$ film 222. Other aspects of the mask formation process are the same as in the first embodiment.

In FIG. 12C, as the trench formation process to be an opening formation process, the SiO$_2$ film 222 and the low-k film 220 are processed by the dry etching technology using the resist film 232 as a mask. The opening 154 to be a trench for preparing damascene wiring is thereby formed in the low-k film 220. Other aspects are the same as in the first embodiment.

Figure 16A:
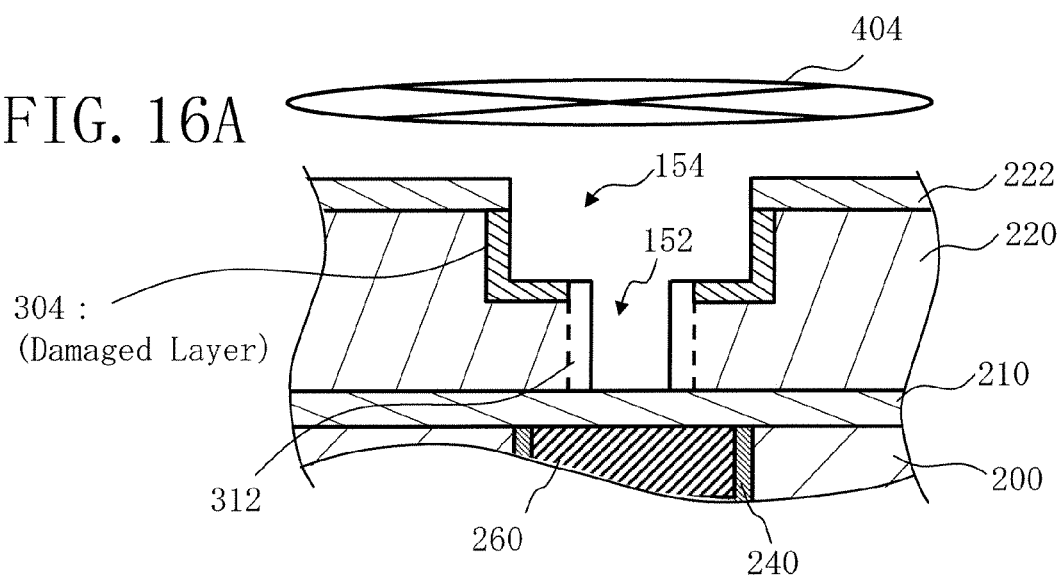
FIG. 16A to FIG. 16C are process sectional views showing processes performed corresponding to the flow chart of FIG. 11.
Figure 16B:
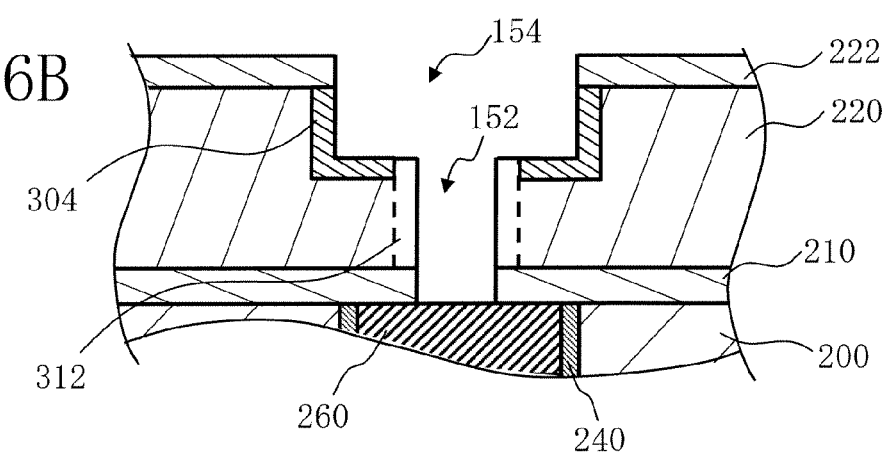
Figure 16C:
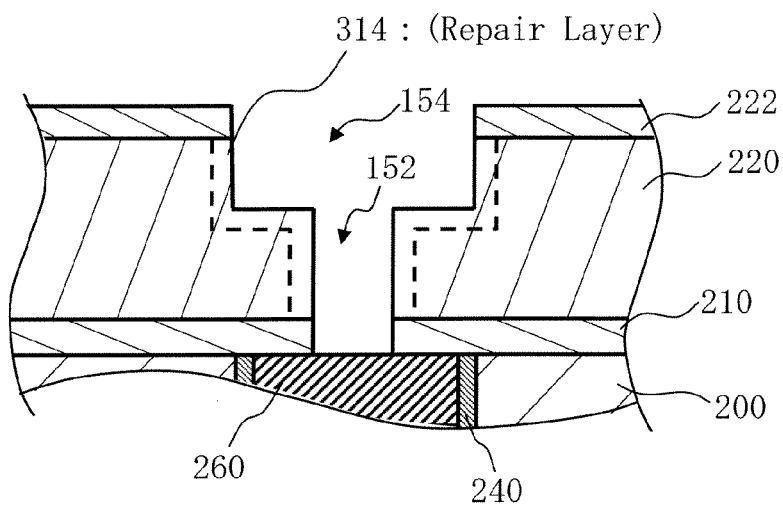

FIG. 16A to FIG. 16C are process sectional views showing processes performed corresponding to the flow chart of FIG. 11. FIG. 16A to FIG. 16C show from the ashing process (S118) to the film quality repair process (S122) in FIG. 11.

In FIG. 16A, as the ashing process, the resist film 232 used as a mask is subsequently separated by the same device as that used for trench formation under the same processing conditions except that only the gas is changed to O$_2$. With the low-k film 220 being exposed to the O$_2$ plasma 404 atmosphere in this way, the surface in contact with the atmosphere and its inside will be damaged. However, since plasma resistance of the repair layer 312 has been improved, as described above, oxidization by oxygen discharge can be inhibited. Thus, here, the wall surface and bottom of the opening 154 are oxidized by oxygen discharge. As a result, the damaged layer 304 is formed on the wall surface and at the bottom of the opening 154.

In FIG. 16B, as the stopper film opening process, the SiCN:H film 210 at the bottom of the opening 152 is processed by the RIE process to finish embedded wiring groundwork. Other aspects are the same as in the first embodiment.

In FIG. 16C, as the film quality repair process, a material replacing the Si—OH group is fed for substitution of the damaged layer 304 formed on the surface of the opening 154 to repair film quality. For this purpose, the same material containing the Si—C—Si group as that used for repairing the wall surface of the opening 152 is used as the substitution material. As has been described above, the Si—OH group is formed in the damaged layer 304. Thus, as a Si—$R_1$ group to replace the Si—OH group, a precursor having, for example, the Si—$NH_2$ group and also having the Si—C—Si bond described above is made to react with the Si—OH group. Here, as an example, $Si(CH_3)_2NH_2SiCH_2Si(CH_3)_2NH_2$ is used. The damaged layer 304 can thereby be repaired. In addition, if the repair layer 312 is a little damaged by exposure to oxygen plasma by ashing, the repair layer 312 can here be repaired together with the damaged layer 304. In ways described above, a repair layer 314 can be formed.

Figure 17:
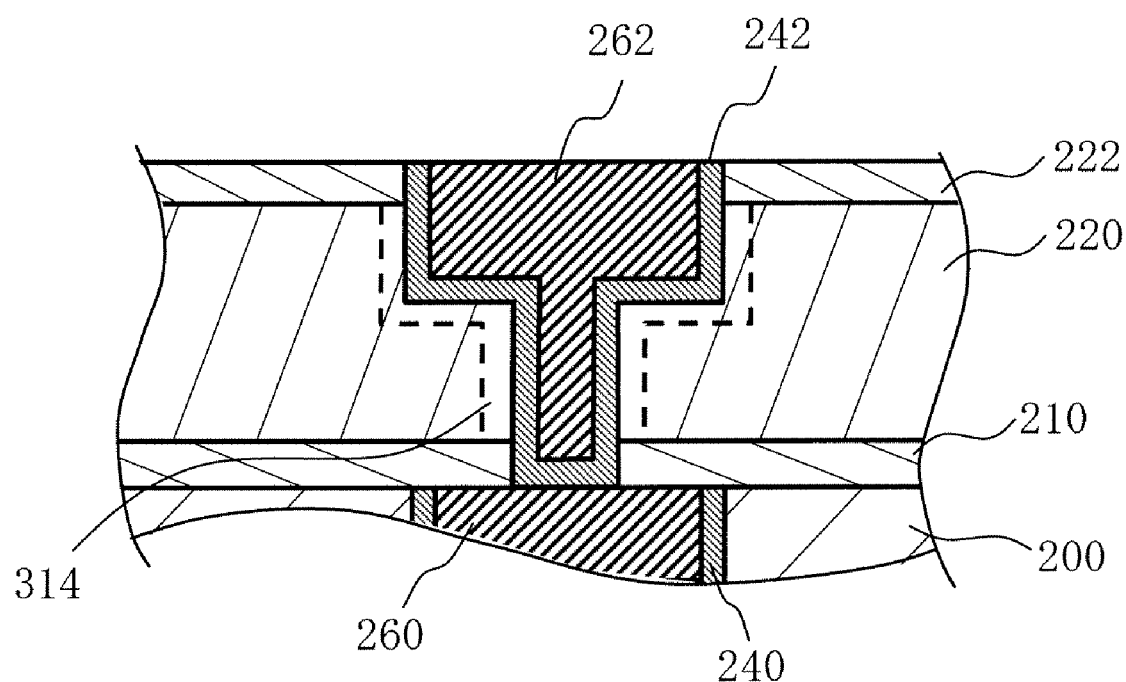
FIG. 17 is a diagram showing a cross section of a semiconductor device after a planarization process by polishing.

FIG. 17 is a diagram showing a cross section of a semiconductor device after a polishing process.

After the repair layer 314 is formed, processes from the barrier metal film formation process (S126) to the polishing process (S132) are performed to form an embedded structure to be Cu wiring shown in FIG. 17. Processes from the barrier metal film formation process (S126) to the polishing process (S132) are the same as those in the first embodiment.

In a manufacturing method for a semiconductor device in the second embodiment, in ways described above, damage caused by the $O_2$ plasma 404 can be repaired and also mechanical strength and plasma resistance can be improved. Results of comparative tests concerning mechanical strength will be shown below. The coefficient of elasticity of a low-k film for which no repair process in the second embodiment had been performed was 9 GPa. The coefficient of elasticity of the low-k film for which no repair process in the second embodiment had been performed could be improved up to 10.5 GPa by curing while irradiating the low-k film with electron beams. In contrast, it has been verified that the Young Modulus can be improved up to 15 GPa by performing the repair process in the second embodiment. These effects are considered to work only around wiring portions, but in actual multi-layer wiring structures of LSI, crack failures of brittle low dielectric constant material are caused under the influence of expansion and contraction of metal. In contrast, no above crack failures were found in semiconductor devices whose mechanical strength around metal portions has been improved by the repair process in the second embodiment.

Moreover, if conventional techniques remain unchanged, wiring reliability of via holes in multi-layer wiring structures of the 45-nm generation will not be obtainable and the fraction defective reaches 50% after 100 hours in a so-called SM test in which an evaluation is made after a heat load being provided by leaving semiconductor devices at high temperature of 175° C. In contrast, by performing the repair process in the second embodiment, the fraction defective was 0% even after 1500 hours. This effect can be considered to result from inhibition of moisture due to a repair effect, improvement of mechanical strength, and improvement of plasma resistance having also the $SiCH_2Si$ structure.

Also, in the second embodiment, the first film repair is made after the opening 152 for a via hole is formed, but the present invention is not limited to this. Though less effective, film repairs may be made together after the opening 154 for a trench is formed.

Moreover, in the second embodiment, $Si(CH_3)_2NH_2SiCH_2Si(CH_3)_2NH_2$ is used as a reactant, but the present invention is not limited to this. A similar effect was verified for materials containing a group such as the Si—NRR' group (R and R' are selected from H or alkyl group such as $CH_3$) and Si—OR" group (R" is selected from alkyl group such as $CH_3$) that reacts with the Si—OH group in a low dielectric constant film and also the Si—C—Si group, though molecular weight must be optimized for properties of low dielectric constant material. A similar effect was gained from alkoxysilane materials having the form of $R_1R_2R_3SiCH_2SiR_4R_5R_6$ in which at least one of $R_1$ to $R_6$ is the alkoxy group and others are hydrogen or the alkyl group. Also, a similar effect was gained from alkoxysilane materials having the form of $R_1R_2R_3SiCH_2Si(CH_2)R_4R_5SiR_6R_7R_8$, which shows that a plurality of ethylene crosslinking groups represented by $Si(CH_2)Si$ exist, in which some of R are the alkoxy group and others are hydrogen or the alkyl group. Similarly, a similar effect was gained from silazane materials, which are reactive with the OH group, having the form of $R_1R_2R_3SiCH_2SiR_4R_5R_6$ in which at least one of $R_1$ to $R_6$ is the silazane group represented by $NH_2$ and others are hydrogen or the alkyl group. Also, a similar effect was gained from silazane materials having the form of $R_1R_2R_3SiCH_2Si(CH_2)R_4R_5SiR_6R_7R_8$, which shows that a plurality of ethylene crosslinking groups represented by $Si(CH_2)Si$ exist, in which some of R are the silazane group represented by $NH_2$ and others are hydrogen or the alkyl group. It was also effective to use, instead of a single chemical solution, a mixed solution of a plurality of chemical solutions.

Also, it was effective to use a mixed solution of one of the above chemical solutions and a chemical solution that does not have the $SiCH_2Si$ bond and is selected from the alkoxysilane class, silazane class, or alkylsilane halide class. The alkoxysilane class includes $Si(OCH_3)_4$ (sometimes called TMOS), $CH_3Si(OCH_3)_3$, $(CH_3)_2Si(OCH_3)_2$ (sometimes called DMDMOS), $Si(OC_2H_5)_4$ (sometimes called TEOS), $CH_3Si(OC_2H_5)_3$, $(CH_3)_2Si(OC_2H_5)_2$, $(CH_3O)_3SiCH=CH_2$ (sometimes called VTMOS), $(C_2H_5O)_3SiCH=CH_2$ (sometimes called VTEOS), and $(CH_3COO)_3SiCH=CH_2$. The silazane class includes $(Me_3Si)_2NH$ (sometimes called HMDS), $HMe_2SiNEt_2$ (sometimes called DMSDEA), $(HMe_2Si)_2NH$ (sometimes called TMDS), $Me_3SiNMe_2$ (sometimes called TMSDMA), $HMe_2SiNMe_2$ (sometimes called DMSDMA), $Me_3SiNEt_2$ (sometimes called TMSDEA), $O=C(NHSiMe_3)_2$ (sometimes called BTSU), $(Me_2N)_2SiHMe$ (sometimes called [DMA]MS), $(Me_2N)_2SiMe_2$ (sometimes called B[DMA]DS), $(SiMe_2NH)_3$ (sometimes called HMCTS), $SiMe_3SiMe_2NMe_2$ (sometimes called DMAPMDS), $SiH_2MeSiHMeNMe_2$ (sometimes called DMADMDS), Disila-aza-cyclopentane (sometimes called TDACP), and Disila-oxa-cyclopentane (sometimes called TDOCP). Further, the alkylsilane halide class includes $(CH_3)_3SiCl$ (sometimes called TMCS) and $(C_2H_5)_3SiCl$ (sometimes called TECS).

Further, even if an organic film that could generate the C—OH group in a damaged layer is formed as a low dielectric constant film, it is expected that these materials react with the C—OH group in the damaged portion to produce a similar effect. Also, irradiation of electron beams was used in the second embodiment for the repair reaction and incorporation of the Si—C—Si bond into a film, but the present invention is not limited to this. For example, only a thermal reaction may be used or irradiation of energy rays such as ultraviolet rays may be used to control the reaction. If, for example, curing by ultra violet rays is used, it is suitable to set the pressure for curing to normal atmospheric pressure, use a high-pressure mercury-vapor lamp of 5 kW, and set the substrate temperature therefor to 400° C. The suitable cure time was about 5 minutes. For heat treatment, it is suitable to set the temperature to 400° C. and the heat treatment time to about 30 minutes.

Third Embodiment

Material in the form of gas that can be used for the repair reaction and incorporation of Si—C—Si backbone structures into the film in the second embodiment may be used as a gas used for the film quality repair process and the pore sealing process in the first embodiment. That is, a gas having a Si—$R_1$ group replacing the Si—OH group and also the Si—C—Si bond is used. Accordingly, in addition to effects of the first embodiment, mechanical strength and plasma resistance of the low-k film 220 can further be improved. Gases of materials that can be used in the second embodiment for film quality repairs react very rarely and a reaction with each other seldom occurs. For example, $Si(CH_3)_2NH_2SiCH_2Si(CH_3)_2NH_2$ reacts with each other very rarely during film quality repairs and a reaction with each other seldom occurs. Then, a pore sealing film can be formed in the pore sealing process by making the gas react with each other by providing reaction energy of plasma or the like. Thus, with a gas of material that can be used in the second embodiment, the film repair reaction and the film formation reaction for pore sealing can be controlled.

Fourth Embodiment

In the first embodiment or the third embodiment, films for pore sealing are deposited on the entire top surface of the substrate and therefore, films deposited at the bottom of the opening 152 to be a via hole must be removed. Thus, in a fourth embodiment, a description focuses on a technique to selectively form a film for pore sealing.

Figure 18:
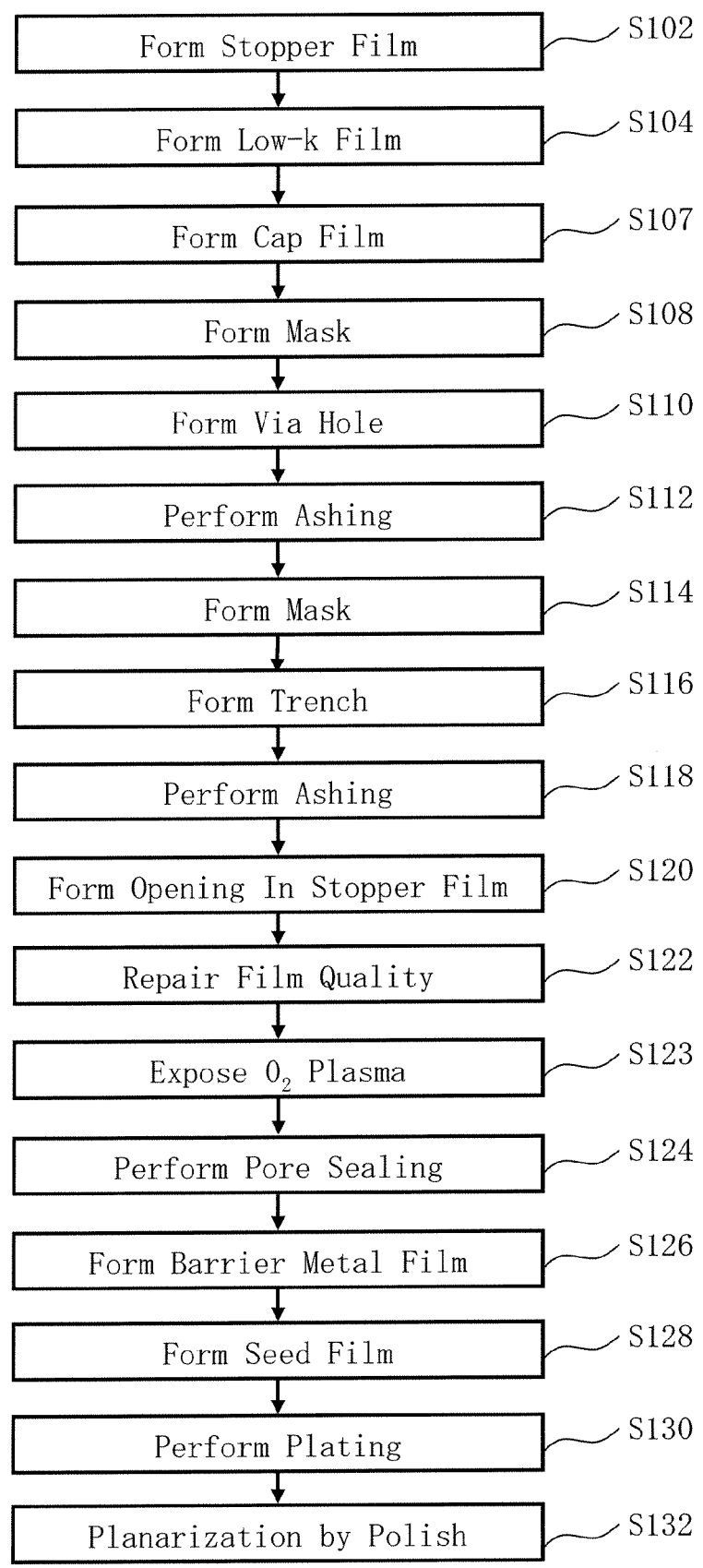
FIG. 18 is a flow chart showing principal parts of a method for fabricating a semiconductor device in a fourth embodiment.

FIG. 18 is a flow chart showing principal parts of a manufacturing method for a semiconductor device in the fourth embodiment. In FIG. 18, the present embodiment performs a series of processes including the stopper film formation process (S102) to form a stopper film, the low-k film formation process (S104) to form a low dielectric constant insulating material (low-k material) film, the cap film formation process (S107) to form a cap film, the mask formation process (S108) to form a mask, the via hole formation process (S110) to form a via hole, the ashing process (S112), the mask formation process (S114) to form a mask, the trench formation process (S116) to form a trench, the ashing process (S118), the stopper film opening process (S120), the film quality repair process (S122) to repair film quality, an $O_2$ plasma exposure process (S123), the pore sealing process (S124), the barrier metal film formation process (S126), the seed film formation process (S128), the plating process (S130) as an example of a copper film formation process to form a Cu film, and the polishing process (S132). FIG. 18 is the same as FIG. 1 except that the $O_2$ plasma exposure process (S123) is added and the SiCN:H film opening process (S125) has been removed.

Processes from the stopper film formation process (S102) to the film quality repair process (S122) are the same as those in the first or third embodiment. Here, as an example, $Si(CH_3)_2NH_2SiCH_2Si(CH_3)_2NH_2$ used in the second embodiment is used as a material for the film quality repair gas. However, the material for the film quality repair gas is not limited to this. Other materials for film quality repairs that can be used in the second embodiment may also be used. Or, materials for film quality repairs that can be used in the first embodiment may be used. That is, any gas having a Si—$R_1$ group for replacing the Si—OH group may be used. By repairing film quality, as shown in FIG. 5B, film quality on the wall surface of the opening 152 and that on the wall surface and at the bottom of the opening 154 are repaired and the repair layer 310 is formed. As already described above, $Si(CH_3)_2NH_2SiCH_2Si(CH_3)_2NH_2$ reacts with each other very rarely and a reaction thereof with each other seldom occurs.

Figure 19A:
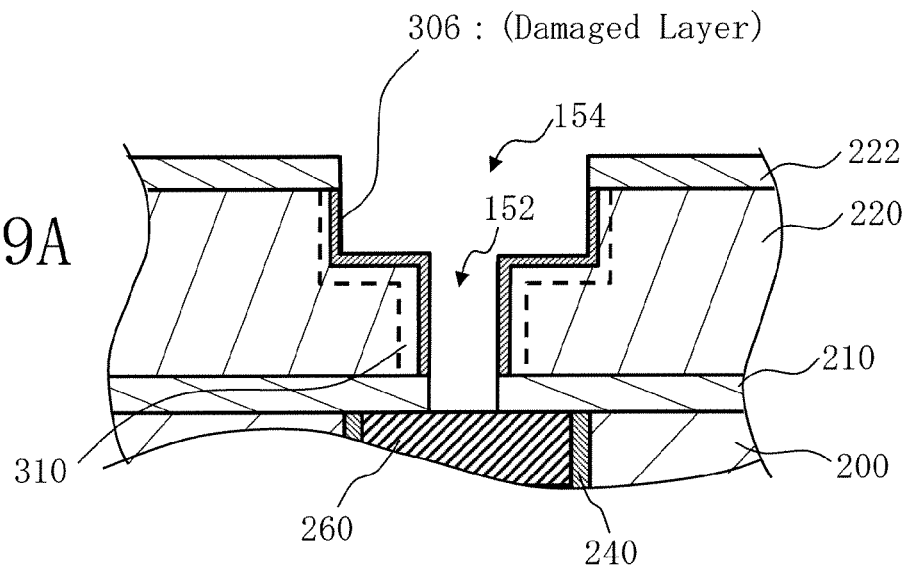
FIG. 19A to FIG. 19C are process sectional views showing processes performed corresponding to the flow chart of FIG. 18.
Figure 19B:
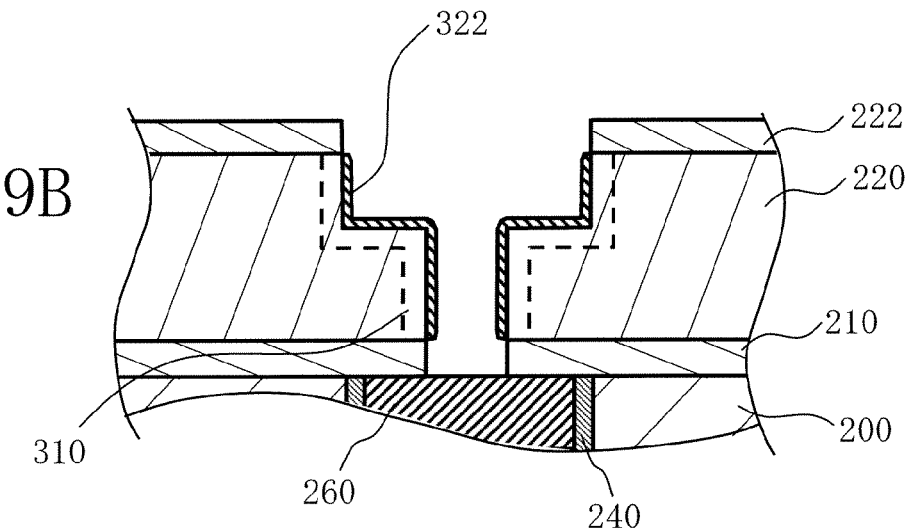
Figure 19C:
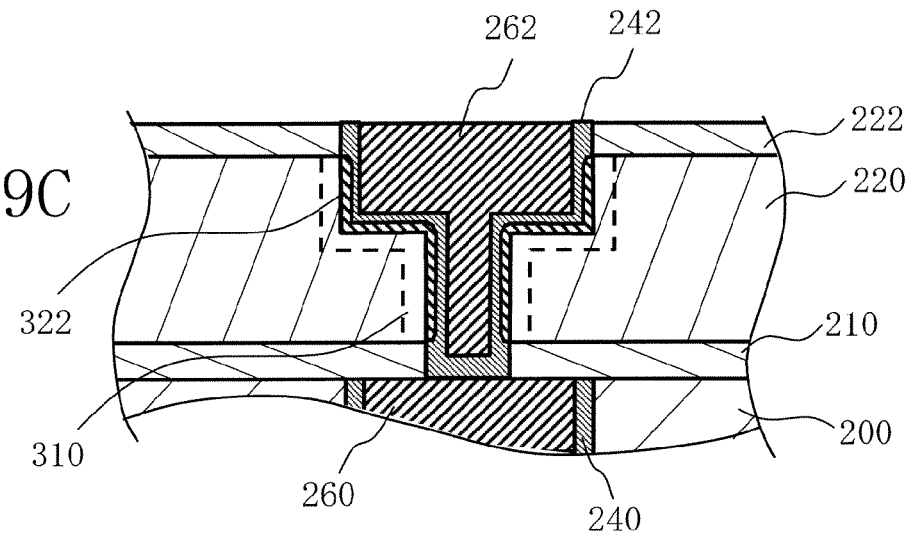

FIG. 19A to FIG. 19C are process sectional views showing processes performed corresponding to the flow chart of FIG. 18. FIG. 19A to FIG. 19C show from the $O_2$ plasma exposure process (S123) to the polishing process (S132).

In FIG. 19A, as the $O_2$ plasma exposure process, after film quality of the low-k film 220 on the surface inside the openings 152 and 154 is repaired, the surface inside the openings 152 and 154 is exposed to an oxygen plasma atmosphere. Subsequently, an $O_2$ discharge is performed inside the reaction vessel used for film quality repairs using a high-frequency power supply of 13.56 MHz. It is suitable to set the discharge power to 50 W and the discharge time to 10 seconds. With the weak discharge compared with that in the ashing process, a damaged layer 306 with the Si—OH bond is again formed only in the top surface layer of the low-k film 220. In this way, with a weak discharge, the damaged layer 306 can be formed near interfaces on the wall surface side of the openings 152 and 154 of the repair layer 310.

In FIG. 19B, as the pore sealing process, after the thin damaged layer 306 is temporarily formed, the gas is changed again to $Si(CH_3)_2NH_2SiCH_2Si(CH_3)_2NH_2$, which was used for film quality repairs and has a heavier molecular weight, inside the same reaction vessel. Accordingly, $Si(CH_3)_2NH_2SiCH_2Si(CH_3)_2NH_2$ is made to react with Si—OH in the damaged layer 306 formed on the top surface. Thereafter, by discharging with weak power of 50 W using a nitrogen ($N_2$) gas, $Si(CH_3)_2NH_2SiCH_2Si(CH_3)_2NH_2$ existing on the surface in a reacted form is allowed to react with each other to deposit a SiCN:H film 322 on the semiconductor substrate. Since Si—OH is formed only on the surface inside the openings 152 and 154 of the low-k film 220, the SiCN:H film 322 formed by the discharge is similarly formed selectively only on the surface (side wall) inside the openings 152 and 154. Thus, in contrast to the first and third embodiments, the SiCN:H film is not deposited on the Cu surface at the bottom of a via hole. Therefore, a process to remove the SiCN:H film on the Cu surface at the bottom of a via hole like in the first and third embodiments is made unnecessary.

By selectively depositing the SiCN:H film 322 on the surface of the low-k film 220 inside the openings 152 and 154, as described above, a cavity of an exposed pore can be closed while preventing deposition at the bottom of a via hole. Then, morphology of the surface deteriorated by the cavity of the pore can be restored to change the surface to a gentle one. An effect of closing a cavity can already be gained when the thickness of SiCN:H film of about 2 nm, but it is desirable to deposit 5 nm or thicker of the SiCN:H film.

Thereafter, processes from the barrier metal film formation process (S126) to the polishing process (S132) are performed to form an embedded structure to be Cu wiring shown in FIG.

19. Processes from the barrier metal film formation process (S126) to the polishing process (S132) are the same as those in the first embodiment.

In the fourth embodiment, as described above, it is possible to perform film quality repairs and also pore sealing selectively by using one of materials that can be used in the first embodiment or the second embodiment.

Using the method in the fourth embodiment, the Si—OH group formed in a low dielectric constant film can be made to disappear. Further, by planarizing morphology of a surface, barrier metal formation can be controlled. Occurrences of wiring failure can thereby be greatly inhibited. An effect of reducing the rate of occurrence of failure when this method is used was verified by performing an accelerated test, which is a technique in the field of reliability technology. A semiconductor device manufactured by using a conventional method in which neither film quality repairs nor pore sealing is performed and that formed by using the method according to the fourth embodiment were heated in a nitrogen atmosphere at 225° C. and normal atmospheric pressure. Then, occurrence frequencies of disconnection failure of wiring were measured using an increase in wire resistance as a guide. As a result, the fraction defective of semiconductor device manufactured by the method according to the fourth embodiment was 0% even after 1000 hours. In contrast, the fraction defective of semiconductor device manufactured by the conventional method reached 75%. These results verify that the method according to the fourth embodiment is extremely effective.

Fifth Embodiment

In each of the above embodiments, improvement of film performance of the low-k film 220 is described by focusing on the surface inside a trench or via hole. In a fifth embodiment, a description thereof is not limited to this and focuses on improvement of mechanical strength and plasma resistance of the surface itself of the low-k film 220.

Figure 20:
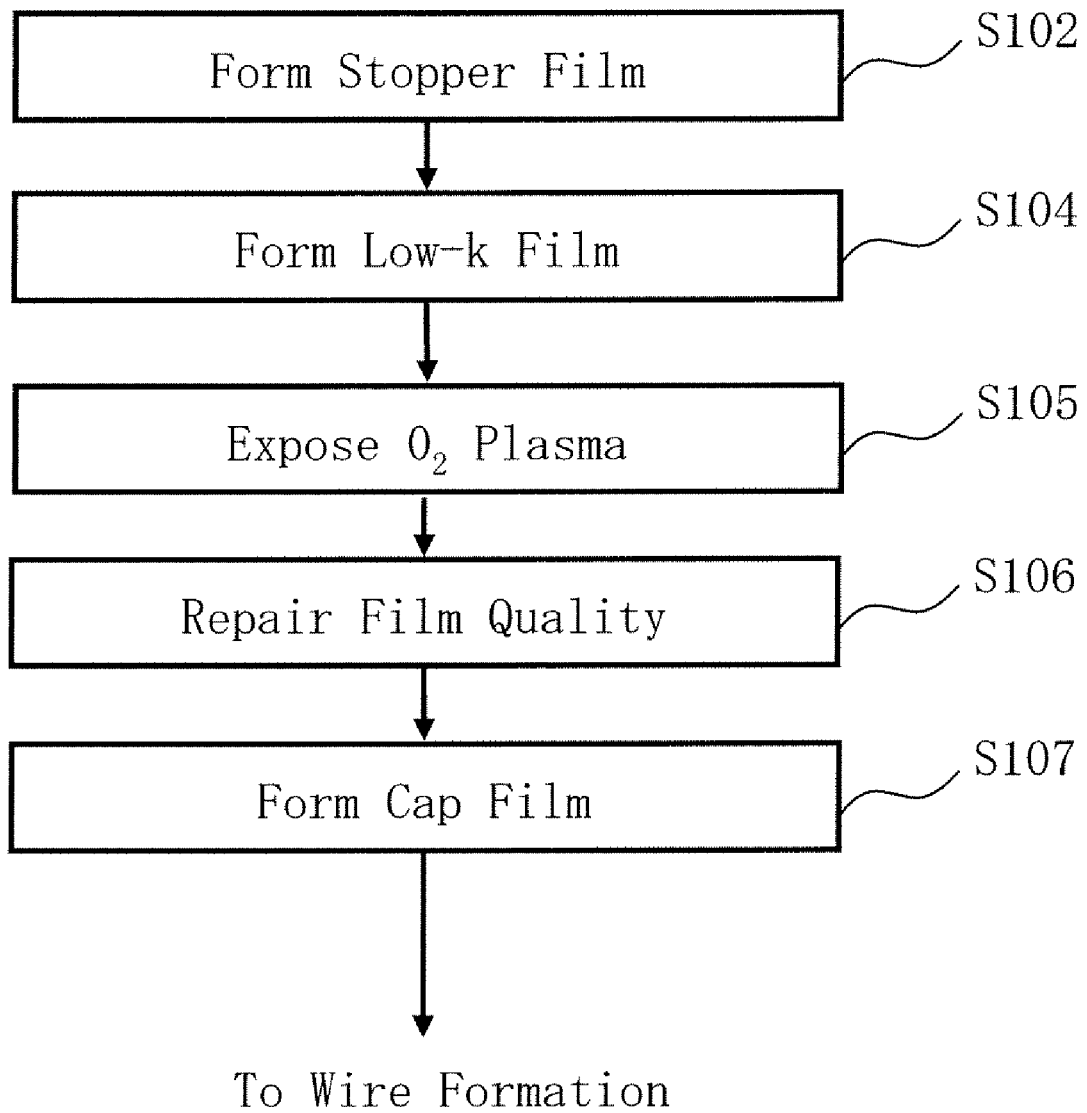
FIG. 20 is a flow chart showing principal parts of a manufacturing method for a semiconductor device in a fifth embodiment and FIG. 21A to FIG. 21C are process sectional views showing processes performed corresponding to the flow chart of FIG. 20.

FIG. 20 is a flow chart showing principal parts of a manufacturing method for a semiconductor device in the fifth embodiment. In FIG. 20, the present embodiment performs a series of processes including the stopper film formation process (S102) to form a stopper film, the low-k film formation process (S104) to form a low dielectric constant insulating material (low-k material) film, an $O_2$ plasma exposure process (S105), a film quality repair process (S106) to repair film quality, and the cap film formation process (S107) to form a cap film.

Processes from the stopper film formation process (S102) to the low-k film formation process (S104) are the same as those of each of the above embodiments. Thus, as shown in FIG. 2B, the low-k film 220 is formed on the substrate 200 with the SiCN:H film 210 therebetween.

Figure 21A:
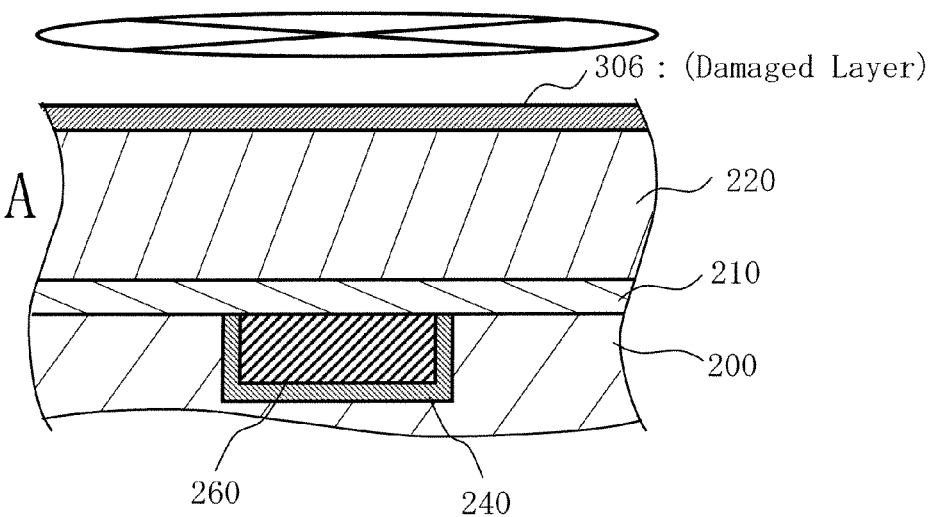
Figure 21B:
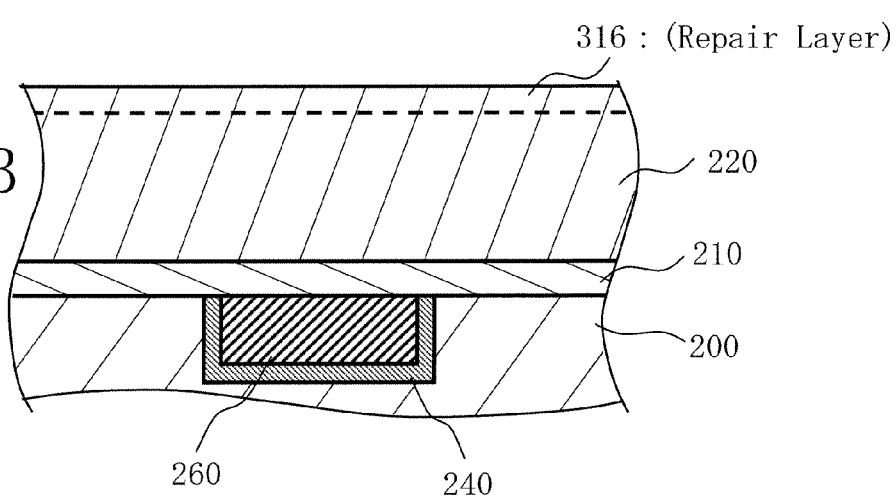
Figure 21C:
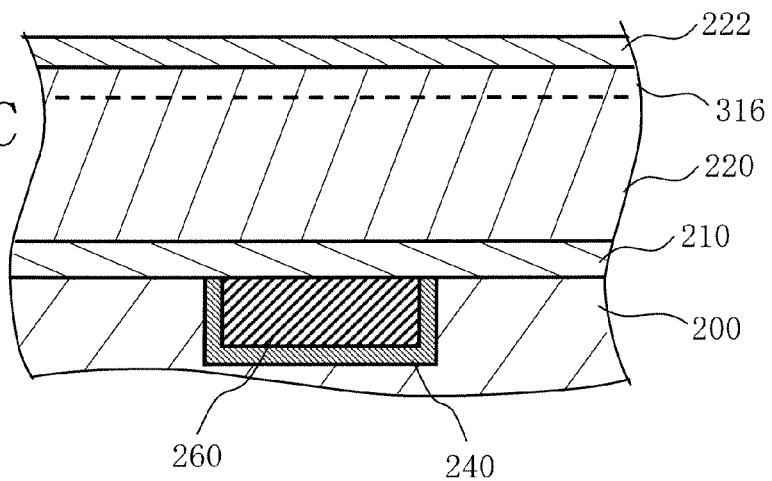

FIG. 21A to FIG. 21C are process sectional views showing processes performed corresponding to the flow chart of FIG. 20. FIG. 21A to FIG. 21C show from the $O_2$ plasma exposure process (S105) to the cap film formation process (S107).

In FIG. 21A, as the $O_2$ plasma exposure process, $O_2$ is discharged by placing a substrate on which the low-k film 220 is formed inside a chamber that can generate plasma. Conditions therefor can suitably be set, for example, by setting the flow rate to 1.7 Pa·m$^3$/s (1000 sccm), frequency to 13.56 MHz, discharge power to 500 W, and pressure inside the chamber to 0.67×10$^3$ Pa (5 Torr). Organic components in the low-k film 220 are oxidized by the $O_2$ discharge and the Si—OH group is formed on the surface of and inside the low-k film 220. That is, the damaged layer 306 is formed.

In FIG. 21B, as the film quality repair process, film quality of the damaged layer 306 is repaired by feeding material that replaces the Si—OH group and also has the Si—C—Si bond to the low-k film 220 exposed to the $O_2$ plasma atmosphere. That is, film quality of the damaged layer 306 is repaired by causing a reaction with material that can be used in the second embodiment. Here, as an example, Si(CH$_3$)$_2$NH$_2$SiCH$_2$Si(CH$_3$)$_2$NH$_2$ to be a precursor having the Si—NH$_2$ group and the Si—C—Si bond is used. Like the second embodiment, the spin-coat method may be used to feed such material. Then, curing by electron beams is performed like in the second embodiment. As described in the second embodiment, the Si—OH group in the damaged layer 306 can thereby be repaired and also a thick repair layer 316 can be formed in which Si—C—Si backbone structures have been incorporated. As has been described above, by incorporating Si—C—Si backbone structures, mechanical strength and plasma resistance on the surface of the low-k film 220 can be improved.

In FIG. 21C, as the cap film formation process, a thin film of the SiO$_2$ film 222 is formed by depositing SiO$_2$ of, for example, 100 nm in thickness as a cap dielectric film on the low-k film 220 by the plasma CVD process. Other aspects are the same as in the first embodiment. Though a discharge is performed using $O_2$, plasma resistance of the low-k film 220 has improved due to incorporation of Si—C—Si backbone structures on the surface of the low-k film 220. Thus, damage by $O_2$ plasma can be inhibited. Hereinafter, processes of forming multi-layer wiring may continue, as described in each of the above embodiments.

The coefficient of elasticity of a conventional low dielectric constant film for which no film quality repair was made was 9 GPa. The coefficient of elasticity was improved to 10.5 GPa after curing the conventional film by irradiating it with electron beams. Then, improvement of the coefficient of elasticity up to 15 GPa was verified by using the method in the fifth embodiment.

Embodiments have been described above with reference to concrete examples. However, the present invention is not limited to these embodiments. For example, an MSQ film by the coating method is used as the low-k film 220 in each of the above embodiments, but the present invention is not limited to this film. Any low dielectric constant film having the relative dielectric constant lower than 3.9 of a SiO$_2$ film may be used. Then, similar effects can be gained regardless of how a film is formed. For example, the low-k film 220 of a SiOC:H film may be formed by the CVD process. In this case, it is suitable, for example, to use trimethylsilane to be organic silane (alkylsilane) and $O_2$ as source gases in the ratio of 2:1 at 1.7 Pa·m$^3$/s (1000 sccm) and 0.84 Pa·m$^3$/s (500 sccm) respectively. It is suitable to set the frequency therefor to 13.56 MHz, discharge power to 1000 W, and pressure inside the chamber to 0.67×10$^3$ Pa (5 Torr). The relative dielectric constant k of an interlayer dielectric film, which is conventionally about 3.9, can thereby be reduced to about 2.9. Incidentally, if the low-k film 220 is formed by the plasma CVD process, $O_2$ plasma exposure can subsequently be performed in the fifth embodiment by a plasma CVD device and therefore, time and efforts can further be saved, making the fifth embodiment more suitable.

A gas is exposed to cause a reaction when film repair processing is performed by introducing the gas in the above embodiments, but reactivity of the introduced gas could be enhanced by activating the gas using a weak discharge. At this point, it was also effective to intermittently perform a discharge, instead of without interruption. For example, it is suitable to use weaker discharge than that for performing the pore sealing.

The thickness of an inter-layer dielectric film, the size, shape, and number of openings and so on can appropriately be selected for whatever required in semiconductor integrated circuits and various kinds of semiconductor devices.

In addition, all manufacturing methods of a semiconductor device that have components of the present invention and whose design can appropriately be changed by a person skilled in the art are included in the scope of the present invention.

For simplification of description, techniques usually used in semiconductor industry, for example, a photolithography process and cleaning before and after processing are omitted, but it is needless to say that such techniques are included in the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device, comprising:
    forming a porous dielectric film above a substrate using a porous insulating material;
    forming an opening in the porous dielectric film;
    repairing film quality of the porous dielectric film on a surface of the opening by feeding a predetermined gas replacing a Si—OH group to the opening; and
    performing pore sealing of the surface of the opening using the same predetermined gas as that used for film quality repairs after repairing the film quality,
    wherein a gas having a Si—C—Si bond is used as the predetermined gas.

2. The method according to claim 1, wherein the predetermined gas has, in addition to the Si—C—Si bond, further a Si—NRR' group (R and R' are selected from H or alkyl group).

3. The method according to claim 1, further comprising:
    exposing the surface of the opening to an oxygen plasma atmosphere after repairing the film quality of the porous dielectric film on the surface of the opening, wherein the pore sealing is performed after the surface of the opening is exposed to the oxygen plasma atmosphere.

4. The method according to claim 3, further comprising:
    performing ashing before repairing the film quality, wherein
    a weaker discharge than that used for the ashing is used for exposure to the oxygen plasma atmosphere.

5. The method according to claim 4, wherein a plasma discharge is performed for performing the pore sealing, the plasma discharge for the pore sealing using a discharge weaker than that used for the ashing.

6. The method according to claim 3, wherein the pore sealing is selectively performed on the surface of the porous dielectric film appearing in the opening.

7. The method according to claim 1, wherein at least one selected from an alkoxysilane class, a silazane class and an alkylsilane halide class is used as the predetermined gas.

8. The method according to claim 1, wherein a plasma discharge is performed when performing the pore sealing.

9. The method according to claim 8, wherein a weaker plasma discharge is performed when the film quality is repaired than when the pore sealing is performed.

10. The method according to claim 1, wherein repairs of the film quality and the pore sealing are processed inside an identical process chamber.

11. The method according to claim 1, wherein a thermal reaction is used as a reaction for repairing the film quality.

12. The method according to claim 1, wherein the pore sealing is performed by forming 5 nm or more of a predetermined film on the surface of the opening.

13. The method according to claim 1, wherein a higher level of energy is fed when performing the pore sealing than when repairing the film quality.

14. A method for fabricating a semiconductor device, comprising:
    forming a porous dielectric film above a substrate using a porous insulating material;
    exposing the porous dielectric film to an oxygen plasma atmosphere; and
    repairing film quality of the porous dielectric film by feeding a predetermined material that replaces a Si—OH group and also has a Si—C—Si bond to the porous dielectric film exposed to the oxygen plasma atmosphere.

15. The method according to claim 14, further comprising:
    forming an opening in the porous dielectric film, wherein
    a process of exposing to the oxygen plasma atmosphere and that of repairing the film quality are performed at least once before the opening is formed and after the opening is formed.

16. The method according to claim 14, wherein the predetermined material is fed as a chemical solution.

17. The method according to claim 14, wherein at least one selected from an alkoxysilane class, a silazane class and an alkylsilane halide class is used as the predetermined material.

18. The method according to claim 14, further comprising:
    forming a dielectric film on the porous dielectric film using a plasma CVD process after repairing the film quality.

19. The method according to claim 14, wherein curing by electron beams is performed when the film quality is repaired.

* * * * *